United States Patent
Liu et al.

(10) Patent No.: US 11,418,294 B2
(45) Date of Patent: Aug. 16, 2022

(54) SINGLE STEP IN-PLACE OPERATION METHOD FOR 5G NR DE-INTERLEAVING, DE-RATE MATCHING, AND HARQ COMBINATION

(71) Applicant: QUALCOMM Incorporated, San Diego, CA (US)

(72) Inventors: Cunzhen Liu, San Diego, CA (US); Alessandro Risso, San Diego, CA (US); Li Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 220 days.

(21) Appl. No.: 17/021,361

(22) Filed: Sep. 15, 2020

(65) Prior Publication Data

US 2021/0091895 A1    Mar. 25, 2021

Related U.S. Application Data

(60) Provisional application No. 62/903,358, filed on Sep. 20, 2019.

(51) Int. Cl.
*H04L 1/18* (2006.01)
*H04L 1/00* (2006.01)

(52) U.S. Cl.
CPC .......... *H04L 1/1845* (2013.01); *H04L 1/0054* (2013.01); *H04L 1/0067* (2013.01); *H04L 1/0071* (2013.01); *H04L 1/1812* (2013.01)

(58) Field of Classification Search
CPC ................. H04L 1/1845; H04L 1/0054; H04L 1/0067; H04L 1/0071; H04L 1/1812;
(Continued)

(56) References Cited

U.S. PATENT DOCUMENTS 8,433,987 B2    4/2013  Fan et al.
9,490,938 B1 *  11/2016 Xu ........................ H04L 25/067
(Continued)

FOREIGN PATENT DOCUMENTS

CN           104753652 B      8/2018
WO    WO-2016047246 A1 *   3/2016   ............ H03M 13/09
(Continued)

OTHER PUBLICATIONS

International Search Report and Written Opinion—PCT/US2020/051040—ISA/EPO—dated Jan. 26, 2021.

*Primary Examiner* — Chi H Pham
*Assistant Examiner* — Vladislav Y Agureyev
(74) *Attorney, Agent, or Firm* — Arent Fox, LLP

(57) ABSTRACT

An apparatus (e.g., receive chain) for wireless communications may perform de-interleaving, de-rate matching, and hybrid automatic repeat request (HARQ) combining in a single step. The apparatus may include a data pool configured to store HARQ log likelihood ratio (LLR) data from previous transmissions. The apparatus may include a HARQ onload controller configured to load HARQ LLR data from the HARQ data pool into a HARQ buffer. The apparatus may include an LLR buffer configured to store received demodulated, interleaved, and rate matched LLR data. The apparatus may include a plurality of processing engines configured to, starting at different locations of the LLR buffer: receive new input data from the LLR buffer; combine the HARQ LLR data from the HARQ buffer with the new input data to generate de-interleaved, de-rate matched, and HARQ combined data; and write the de-interleaved, de-rate matched, and HARQ combined data into the HARQ buffer.

30 Claims, 12 Drawing Sheets

(58) Field of Classification Search
CPC ............... H04L 1/0045; H04L 1/1822; H03M 13/2792; H03M 13/6306; H03M 13/635; H03M 13/6561
See application file for complete search history.

(56) References Cited

U.S. PATENT DOCUMENTS

| | | | |
|---|---|---|---|
| 9,847,853 B1* | 12/2017 | Patel | H04L 1/203 |
| 10,103,843 B1 | 10/2018 | Liu et al. | |
| 10,560,216 B2* | 2/2020 | Lim | H04L 1/0025 |
| 10,637,142 B1* | 4/2020 | Tran | H01Q 1/44 |
| 2010/0158053 A1* | 6/2010 | Kim | H04L 1/0071 |
| | | | 370/536 |
| 2011/0280185 A1* | 11/2011 | Wu | H03M 13/6566 |
| | | | 370/328 |
| 2011/0280186 A1* | 11/2011 | Rasquinha | H03M 13/6558 |
| | | | 370/328 |
| 2011/0317598 A1* | 12/2011 | Takagi | H04L 1/1812 |
| | | | 370/310 |
| 2014/0098799 A1* | 4/2014 | Kang | H04L 1/1822 |
| | | | 370/336 |
| 2014/0241269 A1 | 8/2014 | Smee et al. | |
| 2016/0037524 A1* | 2/2016 | Krzymien | H04L 1/1812 |
| | | | 370/329 |
| 2016/0173233 A1* | 6/2016 | Loghin | H04L 1/0059 |
| | | | 375/295 |
| 2016/0227540 A1* | 8/2016 | Chen | H04L 5/001 |
| 2016/0329990 A1* | 11/2016 | Liu | H04L 1/1812 |
| 2017/0207884 A1* | 7/2017 | Jiang | H04L 1/1835 |
| 2017/0237528 A1* | 8/2017 | Wu | H04L 1/1822 |
| | | | 370/329 |
| 2018/0323807 A1 | 11/2018 | Ahn et al. | |
| 2018/0375616 A1* | 12/2018 | Beale | H04L 1/1816 |
| 2019/0013901 A1* | 1/2019 | Nimbalker | H04L 1/1896 |
| 2019/0140661 A1* | 5/2019 | Calabro | H03M 13/114 |
| 2019/0149176 A1* | 5/2019 | Hui | H03M 13/6356 |
| | | | 714/790 |
| 2019/0215104 A1* | 7/2019 | Salem | H04L 1/1819 |
| 2020/0028622 A1* | 1/2020 | Beale | H04L 27/2621 |
| 2020/0099400 A1* | 3/2020 | Robert Safavi | H03M 13/2792 |
| 2020/0119854 A1* | 4/2020 | Kim | H04L 1/1812 |
| 2020/0162196 A1* | 5/2020 | Jeong | H03M 13/6306 |
| 2020/0204298 A1* | 6/2020 | Wong | H04L 5/0007 |
| 2021/0014832 A1* | 1/2021 | Liu | H04L 5/0053 |
| 2021/0320675 A1* | 10/2021 | Liu | H03M 13/6569 |
| 2022/0110181 A1* | 4/2022 | Miao | H04L 1/1822 |

FOREIGN PATENT DOCUMENTS

| | | | | |
|---|---|---|---|---|
| WO | WO-2017123273 A1 * | 7/2017 | | H03M 13/036 |
| WO | 2017176309 A1 | 10/2017 | | |

\* cited by examiner

| column | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| Processing engine 0 | 0 | 1 | 2 | 3 | 4 | 5 | 6 | 7 | 8 | 9 | 10 | 11 | 12 | 13 | 14 | 15 | 16 | 17 | 18 | 19 | 20 |
| Processing engine 1 | 21 | 22 | 23 | 24 | 25 | 26 | 27 | 28 | 29 | 30 | 31 | 0 | 1 | 2 | 3 | 4 | 5 | 6 | 7 | 8 | 9 |
| Processing engine 2 | 10 | 11 | 12 | 13 | 14 | 15 | 16 | 17 | 18 | 19 | 20 | 21 | 22 | 23 | 24 | 25 | 26 | 27 | 28 | 29 | 30 |
| Processing engine 3 | 31 | 0 | 1 | 2 | 3 | 4 | 5 | 6 | 7 | 8 | 9 | 10 | 11 | 12 | 13 | 14 | 15 | 16 | 17 | 18 | 19 |
| Processing engine 4 | 20 | 21 | 22 | 23 | 24 | 25 | 26 | 27 | 28 | 29 | 30 | 31 | 0 | 1 | 2 | 3 | 4 | 5 | 6 | 7 | 8 |
| Processing engine 5 | 9 | 10 | 11 | 12 | 13 | 14 | 15 | 16 | 17 | 18 | 19 | 20 | 21 | 22 | 23 | 24 | 25 | 26 | 27 | 28 | 29 |
| Processing engine 6 | 30 | 31 | 0 | 1 | 2 | 3 | 4 | 5 | 6 | 7 | 8 | 9 | 10 | 11 | 12 | 13 | 14 | 15 | 16 | 17 | 18 |
| Processing engine 7 | 19 | 20 | 21 | 22 | 23 | 24 | 25 | 26 | 27 | 28 | 29 | 30 | 31 | 0 | 1 | 2 | 3 | 4 | 5 | 6 | 7 |

400a

| column | 0 | 1 | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|---|---|
| Processing engine 0 | 16 | 17 | 18 | 19 | 20 | 21 | 22 | 23 | 24 | 25 | 26 | 27 | 28 | 29 | 30 | 31 | 0 | 1 | 2 | 3 | 4 |
| Processing engine 1 | 5 | 6 | 7 | 8 | 9 | 10 | 11 | 12 | 13 | 14 | 15 | 16 | 17 | 18 | 19 | 20 | 21 | 22 | 23 | 24 | 25 |
| Processing engine 2 | 26 | 27 | 28 | 29 | 30 | 31 | 0 | 1 | 2 | 3 | 4 | 5 | 6 | 7 | 8 | 9 | 10 | 11 | 12 | 13 | 14 |
| Processing engine 3 | 15 | 16 | 17 | 18 | 19 | 20 | 21 | 22 | 23 | 24 | 25 | 26 | 27 | 28 | 29 | 30 | 31 | 0 | 1 | 2 | 3 |
| Processing engine 4 | 4 | 5 | 6 | 7 | 8 | 9 | 10 | 11 | 12 | 13 | 14 | 15 | 16 | 17 | 18 | 19 | 20 | 21 | 22 | 23 | 24 |
| Processing engine 5 | 25 | 26 | 27 | 28 | 29 | 30 | 31 | 0 | 1 | 2 | 3 | 4 | 5 | 6 | 7 | 8 | 9 | 10 | 11 | 12 | 13 |
| Processing engine 6 | 14 | 15 | 16 | 17 | 18 | 19 | 20 | 21 | 22 | 23 | 24 | 25 | 26 | 27 | 28 | 29 | 30 | 31 | 0 | 1 | 2 |
| Processing engine 7 | 3 | 4 | 5 | 6 | 7 | 8 | 9 | 10 | 11 | 12 | 13 | 14 | 15 | 16 | 17 | 18 | 19 | 20 | 21 | 22 | 23 |

400b

SINGLE STEP IN-PLACE OPERATION METHOD FOR 5G NR DE-INTERLEAVING, DE-RATE MATCHING, AND HARQ COMBINATION

CLAIM OF PRIORITY UNDER 35 U.S.C. § 119

This application claims priority to U.S. Provisional Application No. 62/903,358 titled "SINGLE STEP IN-PLACE OPERATION METHOD FOR 5G NR DE-INTERLEAVING, DE-RATE MATCHING, AND HARQ COMBINATION," filed Sep. 20, 2019, which is assigned to the assignee hereof, and incorporated herein by reference in its entirety.

TECHNICAL FIELD

The present disclosure relates generally to wireless communication systems, and more particularly, to interleaving/rate matching and de-interleaving/de-rate matching and HARQ combining for 5G NR.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and apparatuses are provided. The method may include loading stored hybrid automatic repeat request (HARQ) log likelihood ratio (LLR) data from a HARQ data pool into a HARQ buffer. The method may include copying new input data from an LLR buffer to a first processing engine, starting at a first starting point of the LLR buffer. The method may include combining, by the first processing engine, a first portion of the HARQ LLR data with the new input data to generate first de-interleaved, de-rate matched, and HARQ combined data in the HARQ buffer. The method may include copying the new input data from the LLR buffer to a second processing engine acting in parallel with the first DIDRMHC engine, starting at a second starting point of the LLR buffer. The method may include combining, by the second processing engine, a second portion of the HARQ LLR data with the new input data to generate second de-interleaved, de-rate matched, and HARQ combined data in the HARQ buffer. The method may include providing processed data that includes the first de-interleaved, de-rate matched, and HARQ combined data and the second de-interleaved, de-rate matched, and HARQ combined data from the HARQ buffer to a decoder.

In an aspect, the apparatus may include a HARQ data pool configured to store LLR data from previous transmissions. The apparatus may include a HARQ onload controller configured to load stored HARQ LLR data from the HARQ data pool into a HARQ buffer. The apparatus may include an LLR buffer configured to store received demodulated, interleaved, and rate matched LLR data. The apparatus may include a plurality of processing engines. The processing engines may be configured to start at different locations of the LLR buffer and the HARQ buffer. The processing engines may be configured to receive new input data from the LLR buffer. The processing engines may be configured to combine the HARQ LLR data from the HARQ buffer with the new input data to generate de-interleaved, de-rate matched, and HARQ combined data. The processing engines may be configured to write the de-interleaved, de-rate matched, and HARQ combined data into the HARQ buffer.

In another aspect, an apparatus may include means for loading stored HARQ LLR data from a HARQ data pool into a HARQ buffer. The apparatus may include means for copying new input data from an LLR buffer starting at a first starting point of the LLR buffer. The apparatus may include means for de-interleaving at least a first portion and a second portion of the new input data. The apparatus may include means for combining a first portion of the HARQ LLR data with the first portion of the new input data to generate first de-interleaved, de-rate matched, and HARQ combined data in the HARQ buffer. The decoder may include means for combining a second portion of the HARQ LLR data with the second portion of the new input data to generate second de-interleaved, de-rate matched, and HARQ combined data in the HARQ buffer. The apparatus may include means for providing processed data that includes the first de-interleaved, de-rate matched, and HARQ combined data and the second de-interleaved, de-rate matched, and HARQ combined data from the HARQ buffer to a decoder.

The computer-readable medium may be a non-transitory computer-readable medium storing computer executable code. The code when executed by a processor causes the processor to load stored HARQ LLR data from a HARQ data pool into a HARQ buffer. The non-transitory computer-readable medium may include code to copy new input data from an LLR buffer to a first processing engine, starting at a first starting point of the LLR buffer. The non-transitory computer-readable medium may include code to combine, by the first processing engine, a first portion of the HARQ LLR data with the new input data to generate first de-interleaved, de-rate matched, and HARQ combined data in the HARQ buffer. The non-transitory computer-readable medium may include code to copy the new input data from the LLR buffer to a second processing engine acting in parallel with the first processing engine, starting at a second starting point of the LLR buffer. The non-transitory computer-readable medium may include code to combine, by the second processing engine, a second portion of the HARQ LLR data with the new input data to generate second de-interleaved, de-rate matched, and HARQ combined data in the HARQ buffer. The non-transitory computer-readable medium may include code to provide processed data that includes the first de-interleaved, de-rate matched, and HARQ combined data and the second de-interleaved, de-rate matched, and HARQ combined data from the HARQ buffer.

Some implementations of the technology discussed below enable and provide techniques to save memory, reduce design foot-print size, and provide on-the-fly operating conditions for reduced buffer space.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
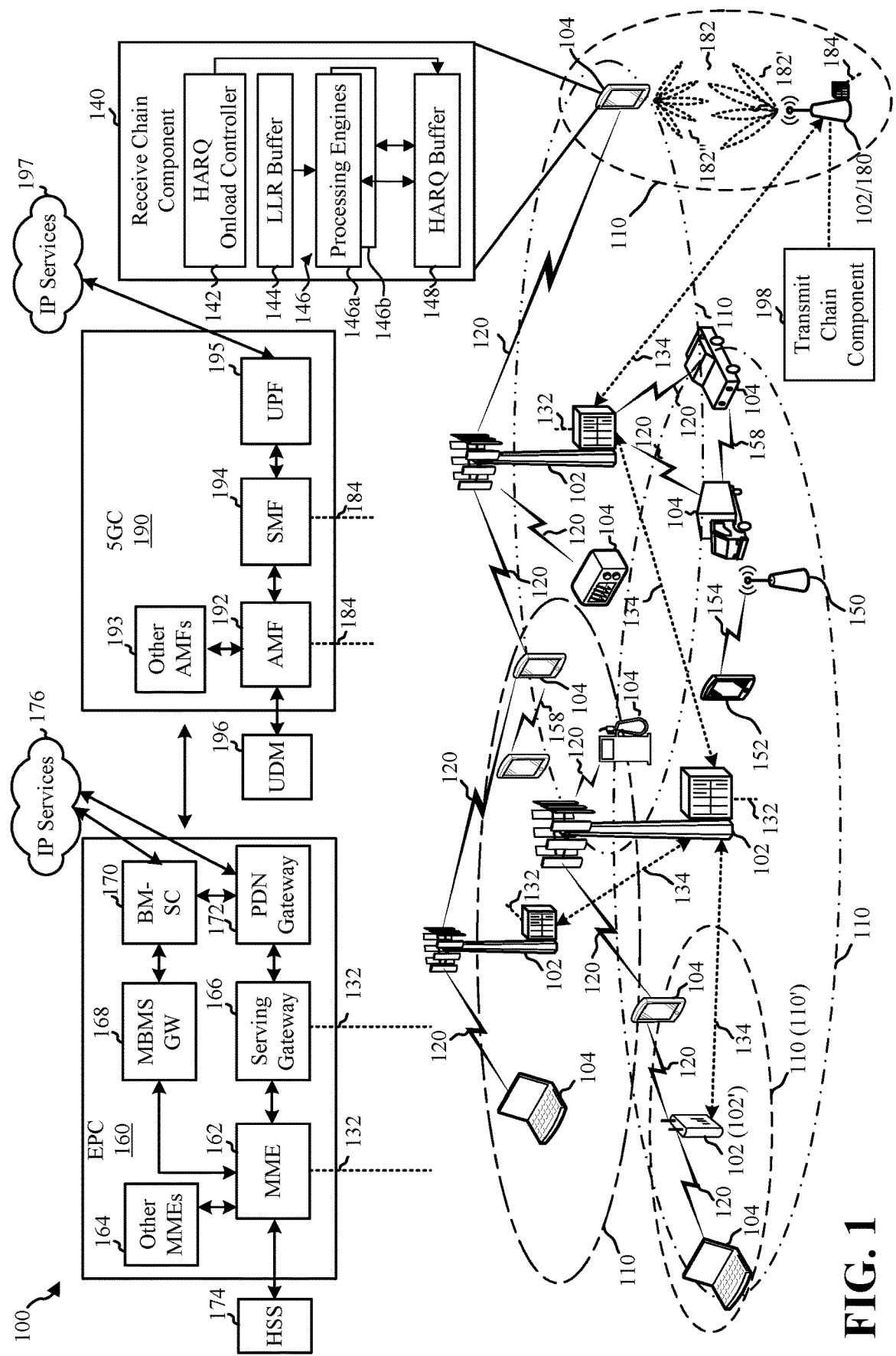
FIG. 1 is a diagram illustrating an example of a wireless communications system and an access network, in accordance with certain aspects of the present description.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts. Although the following description may be focused on 5G NR, the concepts described herein may be applicable to other similar areas, such as LTE, LTE-A, CDMA, GSM, and other wireless technologies.

As noted above, in the 5G NR specification, it is currently envisioned that interleaving is approached differently than LTE. As currently envisioned, in the 5G NR standard, interleaving takes place after rate matching on the transmit side. In contrast, in LTE, rate matching occurs after interleaving on the transmit side. Implementing interleaving after rate matching, as in 5G NR, and employing a repetition rate matching scheme may lead to a need to buffer the incoming LLRs. Given a normally large number of repetitions, this buffering could require a very large buffer resulting in a sizable area penalty for circuitry implementation. For example, the number of LLRs may exceed 1.5 million. At six bits per LLR, a buffer memory in excess of nine million bits would be required.

Additionally, HARQ combination is conventionally performed on the LLRs after de-interleaving and de-rate matching. The results of the de-interleaving and de-rate matching are written into a HARQ buffer and then combined with stored LLRs from previous transmissions. Accordingly, additional memory and processing may be used for the HARQ combination.

Thus, an efficient method and apparatus to perform de-interleaving and de-rate matching, and HARQ combining on the fly, to avoid paying the memory area penalty, is desirable.

As set forth below, this disclosure provides a technique that can reduce the required memory area for buffering LLRs by more than 98%. For example, the memory area can be as small as a single codeblock, which is 3*8448 LLRs. In this case, no multiple memory bank is needed, as a regular codeblock buffer may be used to satisfy the memory requirement.

Technology discussed in the present disclosure can address this challenge by introducing new interleaving/rate matching and de-interleaving/de-rate matching/HARQ-combining techniques. For example, on the transmit side (at a transmitter), multiple interleaver and rate matching engines operate in parallel to access a codeblock buffer at different starting points. On the receive side (at a receiver), multiple de-interleaver and de-rate matching engines may act in parallel to process LLRs per demodulated symbol at different offsets as a result of being interleaved and rate matched at the transmit side. This arrangement advantageously reduces the amount of de-interleaver memory that is required to buffer the LLRs, as described above. For example, use of ten de-interleaver and de-rate matching engines can reduce the amount of required de-interleaver memory to be as small as a single codeblock, which is 3*8448 LLRs. Accordingly, the required memory size is reduced to a fraction of that required without the multiple engine encoding/decoding techniques presented herein.

In an aspect, the de-interleaving and de-rate matching engines may operate on a HARQ buffer for de-rate matching. For example, each de-interleaver and de-rate matching engine may include an internal MIMO_FIFO buffer for storing de-interleaved LLRs over multiple cycles to obtain de-interleaved results. The de-interleaved results may be written to the HARQ buffer to be combined with corresponding results for de-rate matching. Each de-interleaver and de-rate matching engine, when processing the corresponding LLRs for de-rate matching, may read the HARQ buffer, combine the new de-interleaved results with the previous de-interleaved result stored in the HARQ buffer, and write the de-interleaving and de-rate matching result back to the HARQ buffer.

Conventionally, HARQ combining has been performed as a separate process after de-rate matching and de-interleaving. For example, de-rate matched and de-interleaved LLRs in a HARQ buffer would be combined with stored LLRs from previous transmissions. The HARQ buffer would be cleared or zeroed at the start of each transmission. In an aspect, since the multiple de-interleaver and de-rate matching engines can operate on data in the HARQ buffer, HARQ combining may be performed during the de-rate matching and de-interleaving processes by initializing the HARQ buffer with LLRs from previous transmissions. The present disclosure provides for a HARQ onload controller that loads HARQ LLR data from a HARQ data pool into the HARQ buffer. For example, the HARQ onload controller may load the HARQ LLR data based on a HARQ process identifier. The multiple de-interleaving and de-rate matching engines may also perform HARQ combining and may be referred to as de-interleaving, de-rate matching, and HARQ combining (DIDRMHC) engines. Similarly, the term "processing engine" may refer to an engine configured to process received data. A processing engine may be a DIDRMHC engine.

It is envisioned that interleavers having multiple engines can be configured in a variety of manners. According to one implementation, an interleaver may be a rectangular interleaver with N number of rows, where N=Log 2(constellation_size). In one example, if each row is considered as an independent rate matching engine, for up to QAM 1024 constellation, ten independent rate matching engines can run in parallel with different starting offset. For on the fly rate matching and interleaving (e.g., transmit side), the ten engines may read the same codeblock buffer independently at different points. For on-the-fly de-rate matching and de-interleaving (e.g., receive side), ten engines may write de-rate matched results in the same HARQ buffer, at the same time, while combining previous data in the HARQ buffer on the fly. One resulting advantage is a savings of 98% or more of the interleaver/de-interleaver memory size. Another resulting advantage is that no multiple bank memory is needed, as any regular codeblock buffer can be used as a de-interleaver memory. Examples involving three or more engines, six engines, eight engines, and ten engines are presented herein.

Yet, it should be understood that use of ten engines (e.g., on-the-fly encoding or decoding modules) may be used due to support of QAM 1024 being required in the 5G standard, but that any number of two or more engines may be utilized. As a general rule, the number of engines may be greater than or equal to Log 2(constellation_size). Constellation size can be as small as four, in which case the number of engines used can be two.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example implementations, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the aforementioned types of computer-readable media, or any other medium that can be used to store computer executable code in the form of instructions or data structures that can be accessed by a computer.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network (e.g., a 5G Core (5GC) 190). The base stations 102 may include macrocells (high power cellular base station) and/or small cells (low power cellular base station). The macrocells include base stations. The small cells include femtocells, picocells, and microcells.

In an aspect, a UE 104 may include a receive chain component 140 that performs single step in-place de-interleaving, de-rate matching, and HARQ combining. That is, the receive chain component 140 may receive input data (e.g., LLRs from a demodulator), perform the de-interleaving, de-rate matching, and HARQ combining on one or more internal buffers, and write de-interleaved, de-rate matched, and HARQ combined data to a HARQ buffer. In an aspect, the de-interleaved, de-rate matched, and HARQ combined data may be provided to a decoder without a separate process for HARQ combining with previous transmissions. The base station 102/180 may include a transmit chain component 198 that performs rate matching and interleaving operations. Example transmit chains and rate matching and interleaving operations are described in detail in U.S. Pat. No. 10,103,843, which is assigned to the assignee hereof incorporated herein by reference in its entirety. Although FIG. 1 shows the transmit chain component 198 at the base station 102/180 and the receive chain component 140 at the UE 104 (e.g., for downlink transmissions), in an alternative, the base station 102/180 may include a receive chain component 140 and the UE 104 may include a transmit chain component 198 (e.g., for uplink transmissions), or both the base station 102/180 and the UE 104 may include both the transmit chain component 198 and the receive chain component 140.

In an aspect, the receive chain component 140 may include a HARQ onload controller 142 that initializes a HARQ buffer 148 with LLRs from previous transmissions. The receive chain component 140 may include an LLR buffer 144 that stores LLRs from a demodulator and a plurality of processing engines 146 that perform de-interleaving, de-rate matching, and HARQ combining operations on the LLRs in the LLR buffer 144 and in the HARQ buffer 148. The processing engines 146 may be referred to as de-interleaving, de-rate matching, and HARQ combining (DIDRMHC) engines. For example, the HARQ onload controller 142 may load stored HARQ LLR data from a HARQ data pool into the HARQ buffer 148. A first processing engine 146a may receive a portion of new input data from the LLR buffer 144 starting at a first starting point of the LLR buffer 144. The first processing engine 146a may combine the HARQ LLR data with the new input data to generate first de-interleaved, de-rate matched, and HARQ combined data. A second processing engine 146b acting in parallel with the first processing engine 146a may receive a portion of the new input data from the LLR buffer 144 starting at a second starting point of the LLR buffer 144. The second processing engine 146b may combine a second portion of the HARQ LLR data with the new input data to generate second de-interleaved, de-rate matched, and HARQ combined data. The receive chain component 140 may provide input data that includes the first de-interleaved, de-rate matched, and HARQ combined data and the second de-interleaved, de-rate matched, and HARQ combined data. For example, the receive chain component 140 may provide the input data to a decoder that may perform further decoding according to a selected coding scheme.

The base stations 102 configured for 4G LTE (collectively referred to as Evolved Universal Mobile Telecommunications System (UMTS) Terrestrial Radio Access Network (E-UTRAN)) may interface with the EPC 160 through backhaul links 132 (e.g., S1 interface). The base stations 102 configured for 5G NR (collectively referred to as Next Generation RAN (NG-RAN)) may interface with 5GC 190 through backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or 5GC 190) with each other over backhaul links 134 (e.g., X2 interface). The backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, FlashLinQ, WiMedia, Bluetooth, ZigBee, Wi-Fi based on the IEEE 802.11 standard, LTE, or NR.

The wireless communications system may further include a Wi-Fi access point (AP) 150 in communication with Wi-Fi stations (STAs) 152 via communication links 154 in a 5 GHz unlicensed frequency spectrum. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same 5 GHz unlicensed frequency spectrum as used by the Wi-Fi AP 150. The small cell 102', employing NR in an unlicensed frequency spectrum, may boost coverage to and/or increase capacity of the access network.

A base station 102, whether a small cell 102' or a large cell (e.g., macro base station), may include an eNB, gNodeB (gNB), or other type of base station. Some base stations, such as gNB 180 may operate in one or more frequency bands within the electromagnetic spectrum.

The electromagnetic spectrum is often subdivided, based on frequency/wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "Sub-6 GHz" band in various documents and articles. A similar nomenclature issue sometimes occurs with regard to FR2, which is often referred to (interchangeably) as a "millimeter wave" (mmW) band in documents and articles, despite being different from the extremely high frequency (EHF) band (30 GHz-300 GHz) which is identified by the International Telecommunications Union (ITU) as a "millimeter wave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, or may be within the EHF band. Communications using the mmW radio frequency band have extremely high path loss and a short range. The mmW base station 180 may utilize beamforming 182 with the UE 110 to compensate for the path loss and short range.

The EPC 160 may include a Mobility Management Entity (MME) 162, other MMES 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The 5GC 190 may include a Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the 5GC 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a PS Streaming Service, and/or other IP services.

The base station may also be referred to as a gNB, Node B, evolved Node B (eNB), an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or 5GC 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology.

Figure 2:
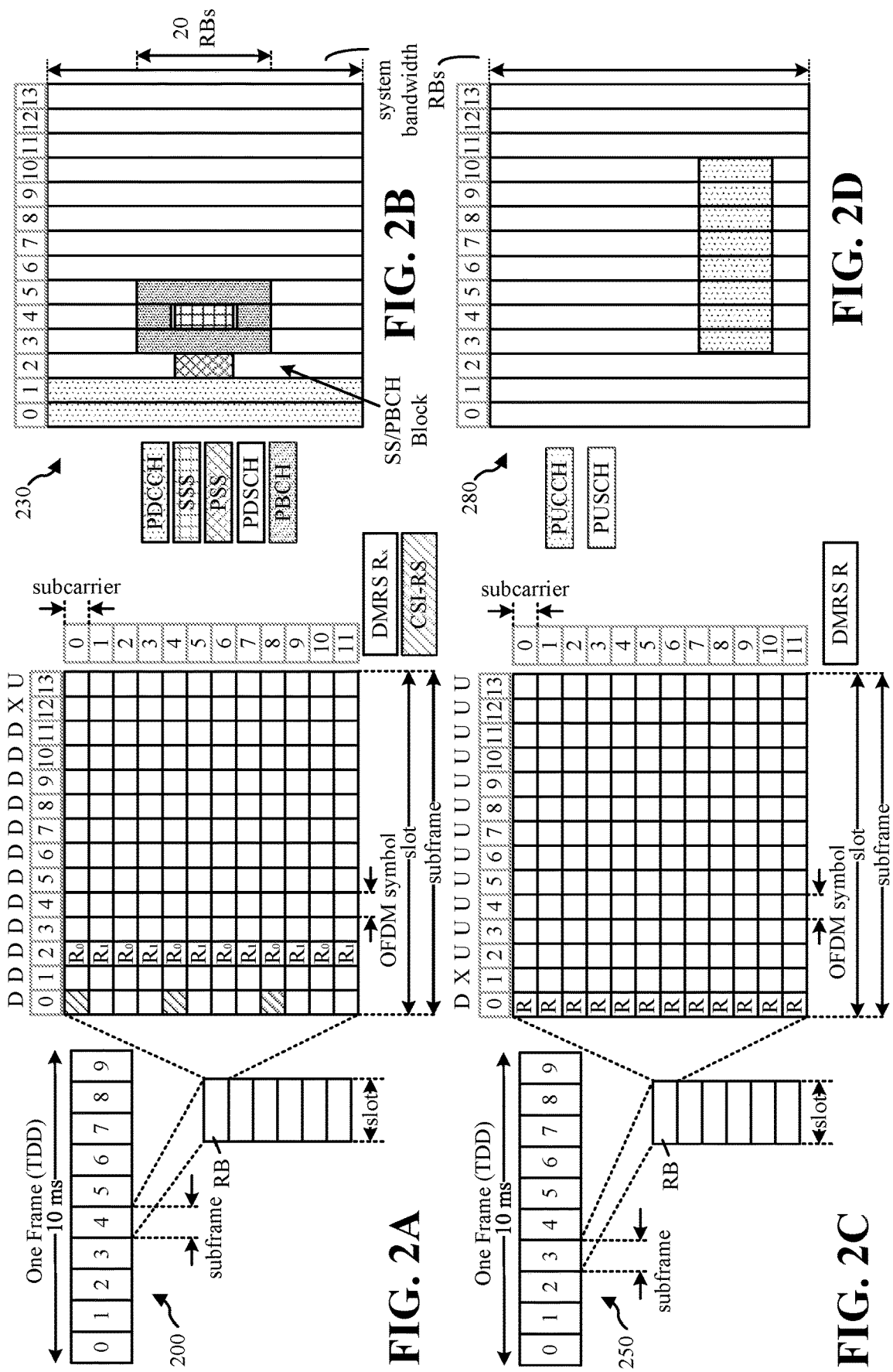
FIG. 2A is a diagram illustrating an example of a first frame, in accordance with certain aspects of the present description.
FIG. 2B is a diagram illustrating an example of DL channels within a subframe, in accordance with certain aspects of the present description.
FIG. 2C is a diagram illustrating an example of a second frame, in accordance with certain aspects of the present description.
FIG. 2D is a diagram illustrating an example of a subframe, in accordance with certain aspects of the present description.

FIG. 2A is a diagram 200 illustrating an example of a first subframe within a 5G/NR frame structure. FIG. 2B is a diagram 230 illustrating an example of DL channels within a 5G/NR subframe. FIG. 2C is a diagram 250 illustrating an example of a second subframe within a 5G/NR frame structure. FIG. 2D is a diagram 280 illustrating an example of UL channels within a 5G/NR subframe. The 5G/NR frame structure may be FDD in which for a particular set of subcarriers (carrier system bandwidth), subframes within the set of subcarriers are dedicated for either DL or UL, or may be TDD in which for a particular set of subcarriers (carrier system bandwidth), subframes within the set of subcarriers are dedicated for both DL and UL. In the examples provided by FIGS. 2A, 2C, the 5G/NR frame structure is assumed to be TDD, with subframe 4 being configured with slot format 28 (with mostly DL), where D is DL, U is UL, and X is flexible for use between DL/UL, and subframe 3 being configured with slot format 34 (with mostly UL). While subframes 3, 4 are shown with slot formats 34, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G/NR frame structure that is TDD.

Other wireless communication technologies may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 7 or 14 symbols, depending on the slot configuration. For slot configuration 0, each slot may include 14 symbols, and for slot configuration 1, each slot may include 7 symbols. The symbols on DL may be cyclic prefix (CP) OFDM (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the slot configuration and the numerology. For slot configuration 0, different numerologies μ 0 to 5 allow for 1, 2, 4, 8, 16, and 32 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and $2^\mu$ slots/subframe. The subcarrier spacing and symbol length/duration are a function of the numerology. The subcarrier spacing may be equal to $2^\mu * 15$ kHz, where μ is the numerology 0 to 5. As such, the numerology μ=0 has a subcarrier spacing of 15 kHz and the numerology μ=5 has a subcarrier spacing of 480 kHz. The symbol length/duration is inversely related to the subcarrier spacing. FIGS. 2A-2D provide an example of slot configuration 0 with 14 symbols per slot and numerology μ=0 with 1 slot per subframe. The subcarrier spacing is 15 kHz and symbol duration is approximately 66.7 μs.

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as $R_x$ for one particular configuration, where 100x is the port number, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs), each CCE including nine RE groups (REGs), each REG including four consecutive REs in an OFDM symbol. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the aforementioned DM-RS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. Although not shown, the UE may transmit sounding reference signals (SRS). The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Figure 3:
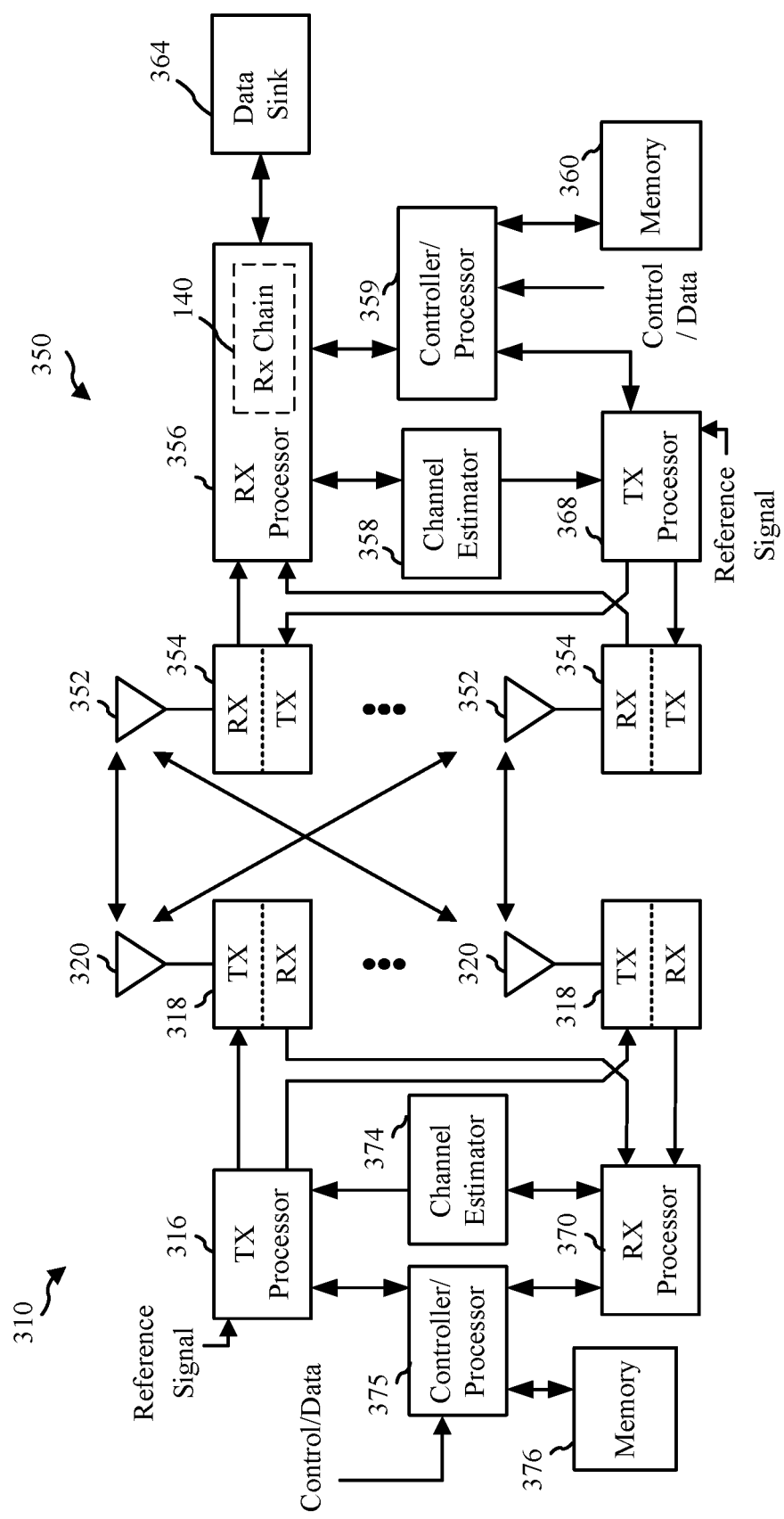
FIG. 3 is a diagram illustrating an example of a base station and user equipment (UE) in an access network, in accordance with certain aspects of the present description.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318TX. Each transmitter 318TX may modulate an RF carrier with a respective spatial stream for transmission.

At the UE 350, each receiver 354RX receives a signal through its respective antenna 352. Each receiver 354RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and de-interleaved to recover the data and control signals that were originally transmitted by the base station 310 on the physical channel. The data and control signals are then provided to the controller/processor 359, which implements layer 3 and layer 2 functionality and/or data sink 364 for storage.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

In an aspect (e.g., for downlink transmissions), at least one of the TX processor 368, the RX processor 356, and the controller/processor 359 may be configured to perform aspects in connection with receive chain component 140 of FIG. 1. For uplink communications, at least one of the TX processor 316, the RX processor 370, and the controller/processor 375 may be configured to perform aspects in connection with receive chain component 140 of FIG. 1.

Figure 4A:
FIG. 4A is a table of an example distribution of LLRs, in each column, among multiple processing engines, in each row, with no initial offset, in accordance with certain aspects of the present description.

Turning to FIG. 4A, an example de-interleaver memory 400a for use with eight processing engines 146 may be configured as a rectangular memory with QAM256 constellation having 32 coded bits with 21 columns. The de-interleaver memory 400a may store LLRs from a demodulator. The de-interleaver memory 400a may be an example of the LLR buffer 144. The LLRs per demodulated symbol, on which de-interleaving and de-rate matching would be performed, contain the values in various columns of the illustrated table in memory 400a (e.g., in column 0: [0 21 10

31 20 9 30 19], in column 1: [1 22 11 0 21 10 31 20], . . . ). The eight processing engines 146 may each be configured to run on a single line with a same coded bit size 32 in parallel, but with different starting offsets. For example, an offset may be determined according to:

$$starting\_offset=(line\_index*column\_number)\%(coded\_bits),$$

where line_index=0, 1, 2, . . . 9. It is also envisioned that inter-engine combining may occur only when the number of coded bits is greater than or equal to the total number of LLRs in the LLR buffer (e.g., the number of columns (e.g., row length) times the number of rows (e.g., row length) of the de-interleaver memory 400a). However, another example de-interleaver memory configured for use with six processing engines may perform intra transmission time interval (TTI) combining and line engine combining when the number of coded bits is less than the total number of LLRs in the LLR buffer.

Figure 4B:
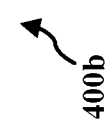
FIG. 4B is a table of an example distribution of LLRs, in each column, among multiple processing engines, in each row, with an initial offset, in accordance with certain aspects of the present description.

Although the foregoing examples show starting from 0 with respect to a starting LLR, it should be understood that implementations may start from any number. For example, in operation according to implementations of the present disclosure a retransmitted LLR can start at any location, such as being offset by an e_offset amount. The starting point of each line engine in such an implementation may thus follow the following equation:

$$starting\_offset=(e\_offset+ line\_index*column\_number)\%(coded\_bits),$$

where line_index=0, 1, 2, . . . 9. FIG. 4B shows an example de-interleaver memory 400b for use with eight processing engines 146 in an example where e_offset=16, column_num=21, and coded bits=32.

Figure 5:
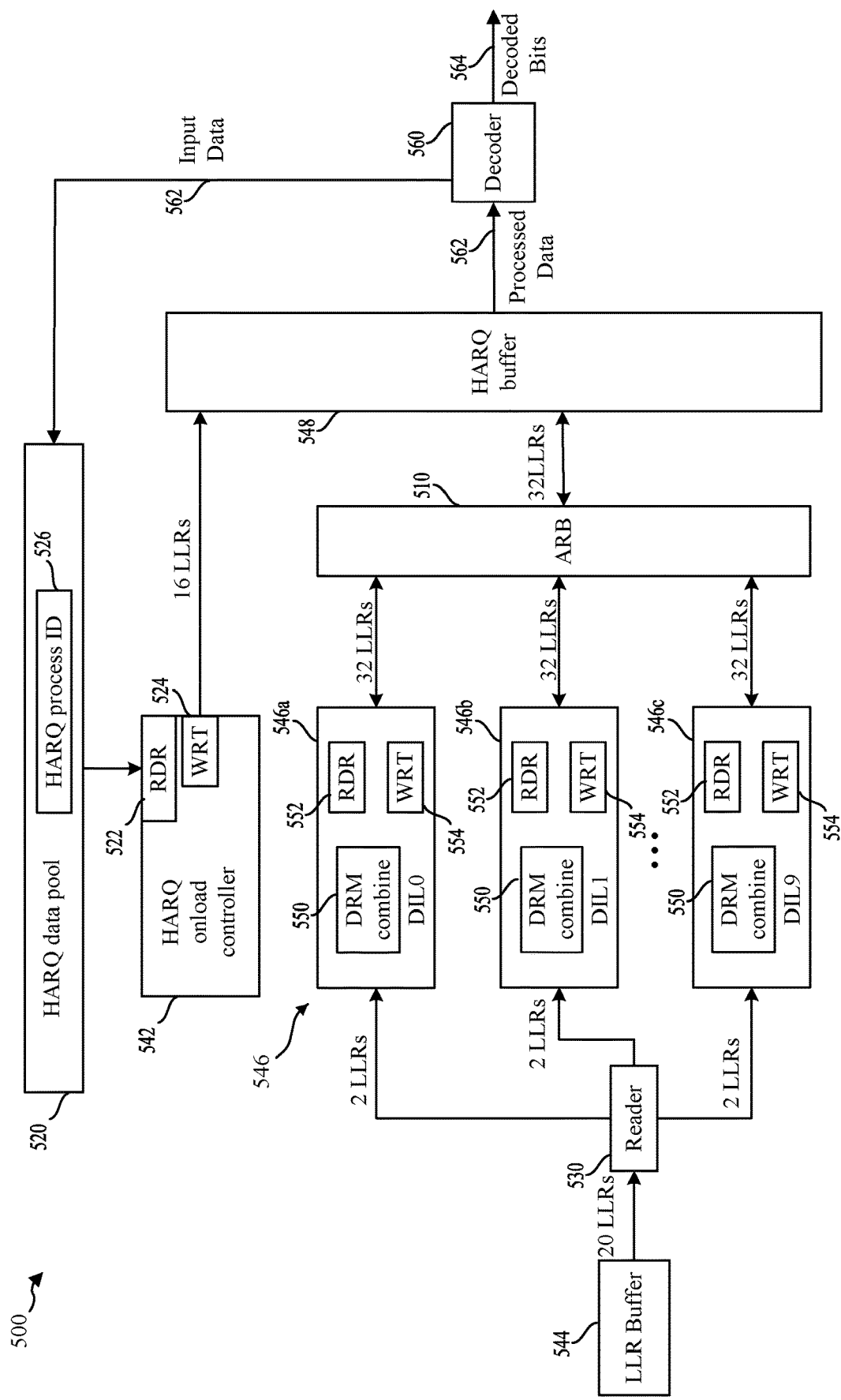
FIG. 5 is a diagram of an example receive chain, in accordance with certain aspects of the present description.

Turning now to FIG. 5, an example receive chain 500 has up to ten processing engines 546, such as processing engines 546a, 546b, 546c, that each have their own sets of adders for performing combining of de-rate matching results with data stored in HARQ buffer 548. The receive chain 500 may include a reader 530 that reads new input data from an LLR buffer 544 and distributes the new input data to the processing engines 546. The LLR buffer 544 may correspond to the LLR buffer 144 and may be a memory that stores demodulated symbols in the form of LLRs. For example, the LLR buffer 544 may be a de-interleaver memory such as the de-interleaver memory 400a, 400b. That is, the reader 530 may access the LLR buffer 544 and distribute (e.g., copy) LLRs to each of the processing engines 546 via an on-the-fly deinterleaver. For example, the reader 530 may copy the LLRs in each column (e.g., as illustrated in FIG. 4A and FIG. 4B) to the indicated processing engine. Accordingly, the LLRs received at each processing engine 546 may start at different offsets for each processing engine 546.

The receive chain 500 may include a HARQ onload controller 542 (corresponding to HARQ onload controller 142) that reads LLRs from a HARQ data pool 520. The HARQ onload controller 542 may be a circuit including a reader that accesses the HARQ data pool 520 based on a HARQ process ID 526 and a writer that copies the data to an address of the HARQ buffer 548. The HARQ data pool 520 may be a memory that stores LLRs for previous transmissions. In an aspect, for example, the HARQ data pool 520 may store LLRs according to a HARQ process ID 526. The stored LLRs may be de-interleaved and de-rate matched LLRs from a previous transmission. For instance, the HARQ data pool 520 may store the de-interleaved and de-rate matched LLRs in HARQ buffer 548 when a decoding process is unsuccessful. When the receive chain 500 receives an indication that a current transmission is a retransmission (e.g., based on downlink control information (DCI)), the HARQ onload controller 142 may use a reader (RDR) 522 to read the HARQ data pool 520 for the HARQ process ID 526. The HARQ onload controller 142 may use a writer 524 to write the LLRs to the HARQ buffer 548. Accordingly, the HARQ onload controller 142 may initialize the HARQ buffer 548 with the stored HARQ LLRs corresponding to the current transmission. The HARQ buffer 548 may be a memory including a number of addresses (e.g., 10 addresses as illustrated in FIG. 5) and may store a number of LLRs (e.g., 32 as illustrated in FIG. 5) at each address. In an aspect, the HARQ buffer 548 may be less than a codeblock in size and may be implemented as a codeblock buffer.

In operation, the reader 530 reads a number of LLRs that is a positive integer multiple of the number of processing engines 546 (e.g., twenty LLRs for ten processing engines 546) at a time from LLR buffer 544 and distributes the positive integer number (e.g., 2) of LLRs each cycle to each of the processing engines 546. The positive integer number of LLRs may be written in a de-interleaved order to each processing engine. The processing engines 546 each include a DRM combiner 550 that stores the LLRs until a the number of de-interleaved LLRs corresponding to a line of the HARQ buffer 548 is received at the DRM combiner 550. In turn (e.g., when de-interleaving is complete), read components (RDR) 552 and write components (WRT) 554 of each of the processing engines 546 access HARQ buffer 548 via arbitration block 510, and each processing engine 546 performs read, combine, and write operations in the HARQ buffer 548 at different starting points. For example, the RDR 552 reads LLRs from the HARQ buffer 548. For a retransmission, the LLRs may be initialized based on the previous transmission. Accordingly, when the DRM combiner 550 combines the de-interleaved LLRs with the LLRs from the HARQ buffer 548, the DRM combiner 550 may perform both de-rate matching and HARQ combining. The WRT 554 may write the combined LLRs back to the HARQ buffer 548 for further de-rate matching or decoding.

The receive chain 500 may include a decoder 560 that performs decoding of the LLRs based on a coding scheme such as low density parity-check (LDPC) or turbo coding. The HARQ buffer 548 may provide input data 562 that includes at least first de-interleaved, de-rate matched, and HARQ combined data generated by a first processing engine 546a and second de-interleaved, de-rate matched, and HARQ combined data generated by a second processing engine 546b. The decoder 560 may perform a decoding operation to determine decoded bits 564. The decoder 560 may determine whether the decoding operation is successful. If the decoding operation is successful, the decoder 560 may output the decoded bits 564 (e.g., to controller processor 359 and/or data sink 364. If the decoding operation is unsuccessful, the decoder 560 may store the input data 562 including the de-interleaved, de-rate matched, and HARQ combined data in the HARQ data pool 520 in association with a HARQ process ID 526. The stored input data 562 may be loaded into the HARQ buffer 548 when a retransmission is received and the receive chain 500 may combine the stored input data with the new input data.

Figure 6:
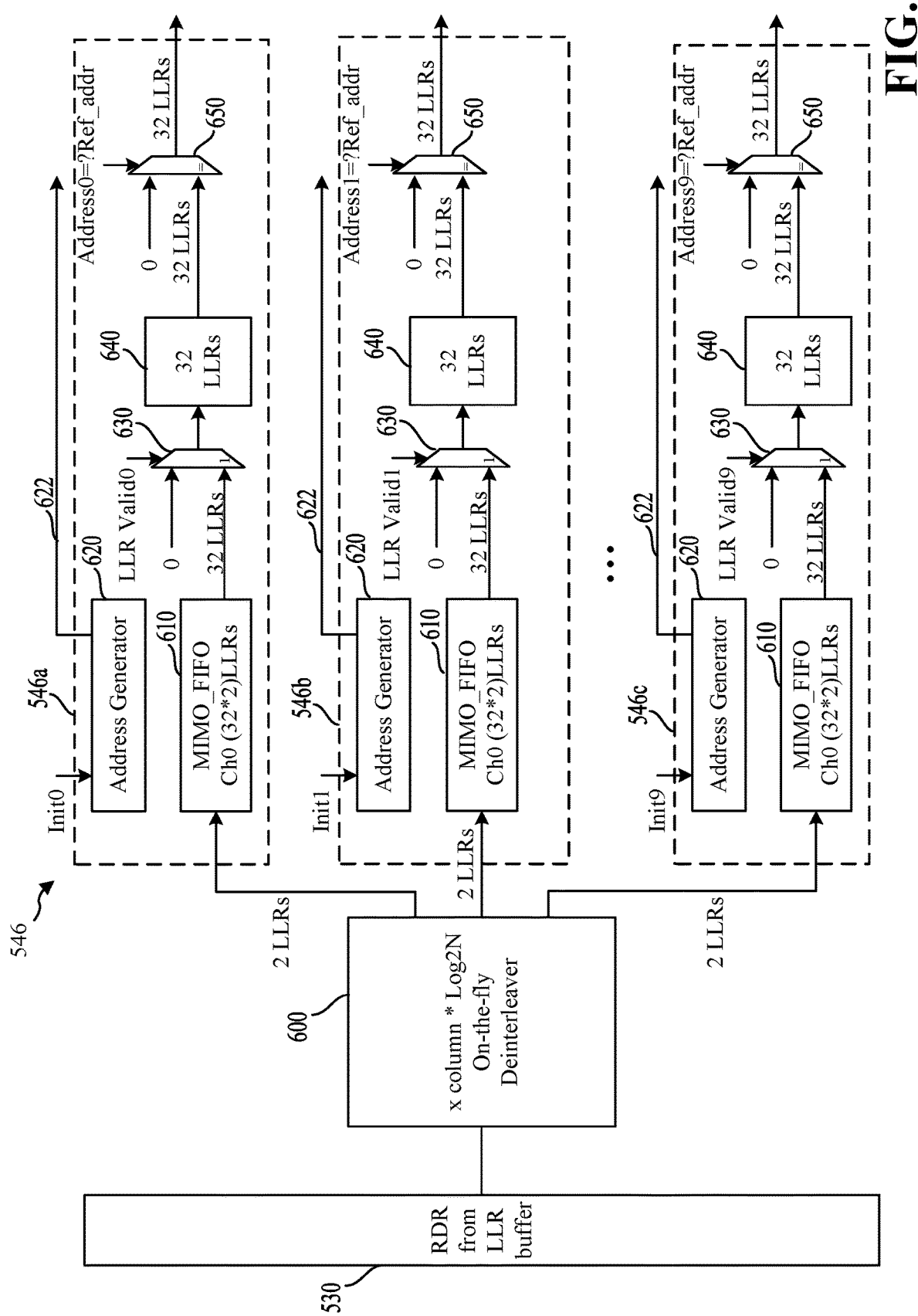
FIG. 6 is a diagram of example processing engines, in accordance with certain aspects of the present description.

Turning now to FIG. 6, further details of an example implementation of processing engines 546 (of FIG. 5) are illustrated. Reader 530 reads one or more columns of LLRs from the LLR buffer 544 to an on-the-fly de-interleaver 600 having x columns, where x is a positive integer. Each column may store Log 2N LLRs. As shown in FIGS. 4A and 4B, the length of a column may correspond to a number of processing engines 546. The on-the-fly de-interleaver 600 may write a row (e.g., across the x columns) of LLRs to each processing engine 546. Accordingly, the on-the-fly de-interleaver 600 may provide one or more LLRs in each cycle to each of processing engines 546 (e.g., 546a-546c), and the processing engines 546 may store the LLRs in MIMO_FIFO registers 610 that are each two LLRs wide and thirty-two LLRs long. By storing the received LLRs from the on-the-fly de-interleaver 600 until the length is reached, the processing engines 546 arrive at de-interleaving results 640 that are thirty-two LLRs in length. For example, a selector 630 may determine which row of thirty-two LLRs of MIMO_FIFO register 610 is valid. Additionally, each processing engine 546 may include an address generator 620 that generates an engine address 622 (e.g., Address0), which may be based on an initial value (e.g., init0) provided by reader 530 (e.g., an LLR in LLR buffer 544). A reference address (Ref_addr) may correspond to a location in HARQ buffer 548 with which the de-interleaving results 640 are to be combined and stored. When the reference address matches the engine address, a selector 650 may provide the de-interleaving results 640 to the arbitration block 510, otherwise the selector 650 may provide a value of 0.

Figure 7:
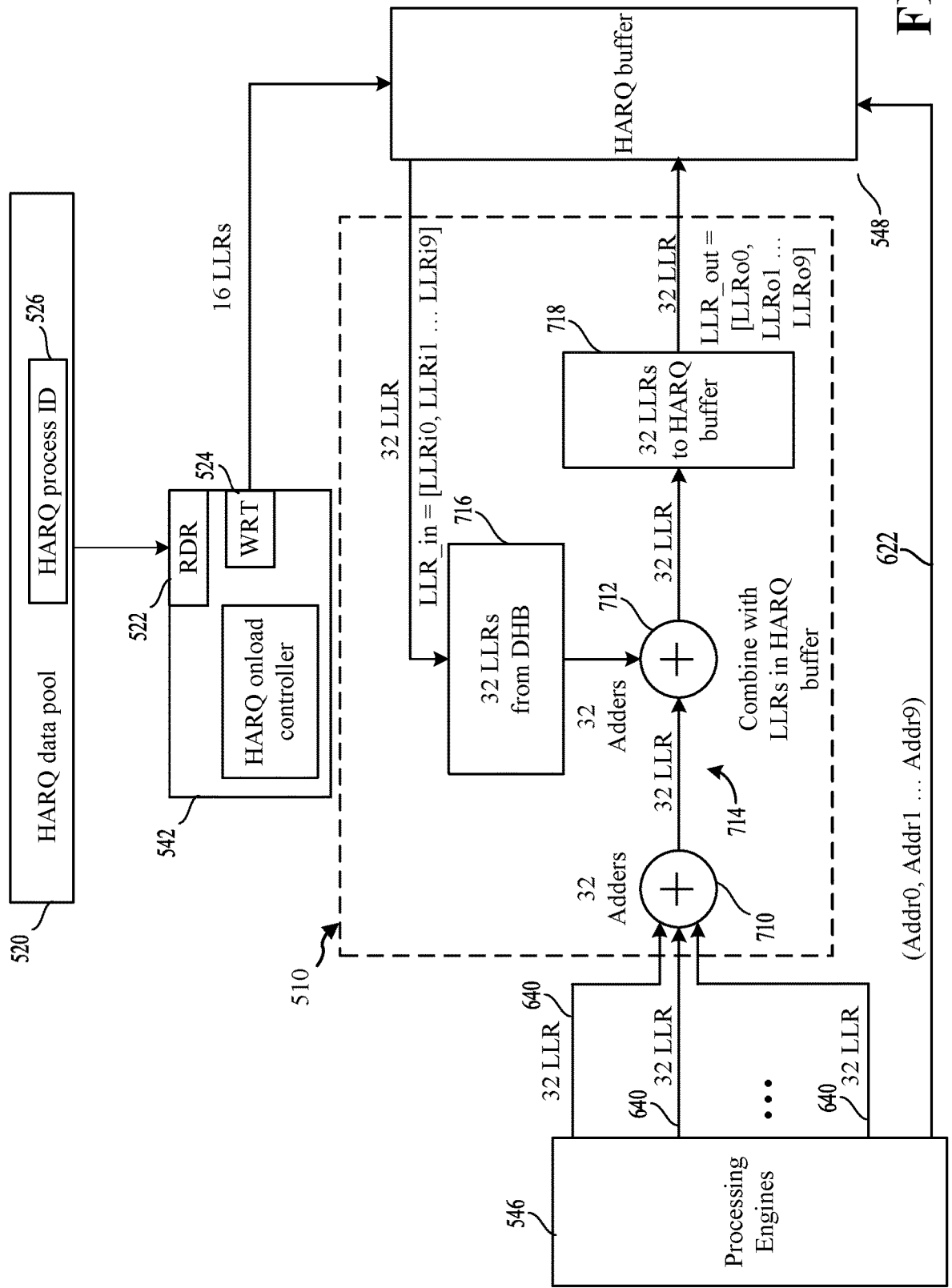
FIG. 7 is a diagram of example adders within an arbitration block, in accordance with certain aspects of the present description.

Turning now to FIG. 7, further details of an example implementation of arbitration block 510 are illustrated. The processing engines 546 may all share adders 710 and 712 for performing combining of de-rate matching results with data stored in HARQ buffer 548. The processing engines 546 may output the de-interleaving results 640 corresponding to the engine address 622 matching the reference address. The adder 710 and the adder 712 may each include an adder for LLRs for each of the coded bits (e.g., 32 adders). The adder 710 may combine de-interleaving results 640 from different processing engines 546 operating on LLRs corresponding to the same engine address 622 in HARQ buffer 548 to generate combined de-interleaving results 714. The adder 712 may take turns accessing the HARQ buffer 548 at different starting points (e.g., Ref_addr) to combine the combined de-interleaving results 714 with the data 716 already in the HARQ buffer 548. That is, the adder 712 may sequentially add the LLR for a current address i ($LLR_i$) of the HARQ buffer 548 to the current de-interleaving results 714. More specifically, the data 716 may include 32 LLRs for the $LLR_i$. The adder 712 may add the data 716 with the de-interleaving results 714 that correspond to the address. Accordingly, the adder 712 may be time shared by cycling through the addresses of the HARQ buffer 548. As discussed above, the HARQ onload controller 542 may initialize the HARQ buffer 548 with stored LLRs from the HARQ data pool 520 based on the HARQ process ID 526. Accordingly, the adder 712 may perform combining for de-rate matching and HARQ combining. Therefore, each processing engine 546 may write de-interleaving, de-rate matching, and HARQ combining results 718 to the correct addresses in the HARQ buffer 548.

Figure 8:
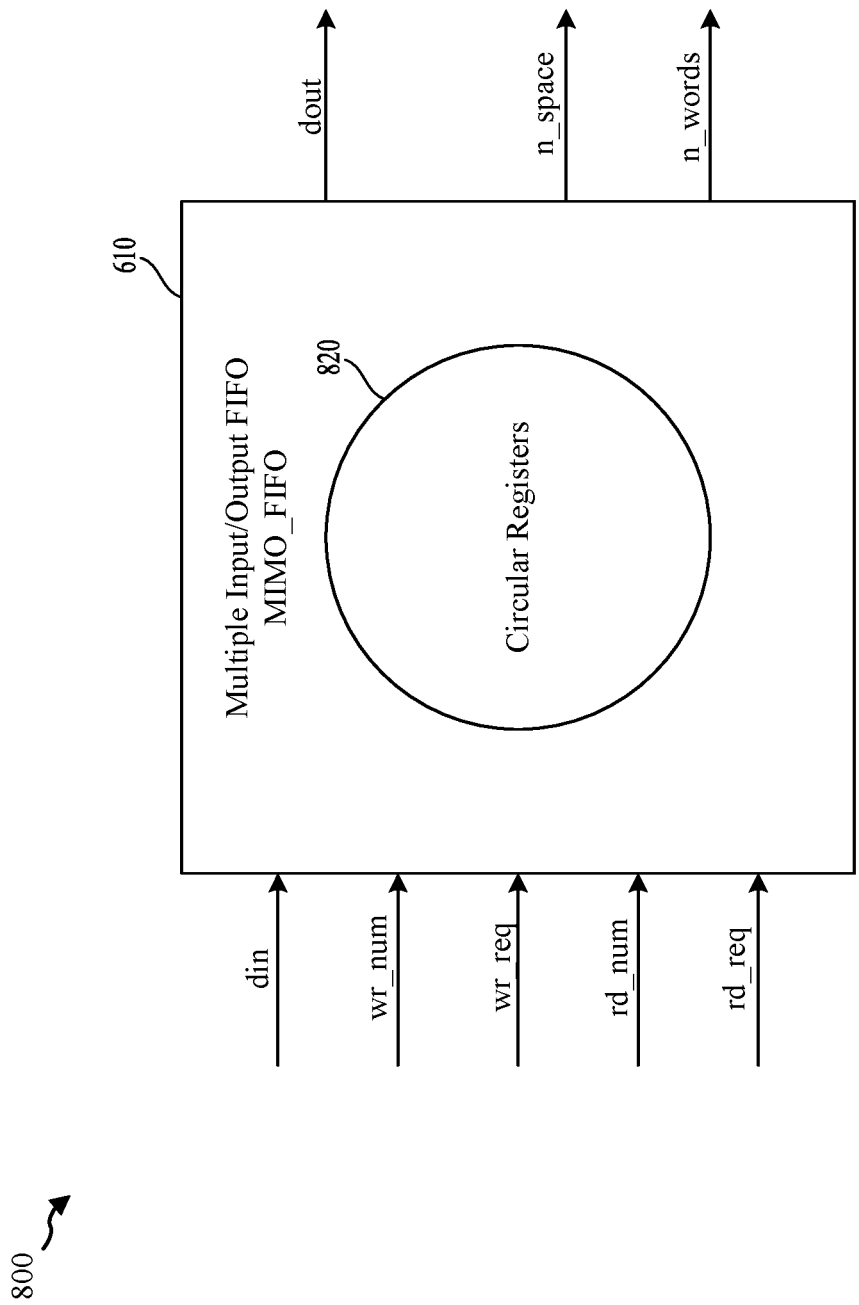
FIG. 8 is a diagram of an example multiple input multiple output first in first out register for use in a processing engine, in accordance with certain aspects of the present description.

Turning now to FIG. 8, a diagram 800 illustrates an example implementation of the MIMO_FIFO register 610 as a circular register 820. Each processing engine 546 may employ a respective circular register 820 as a MIMO_FIFO register 610 having various inputs and outputs. For example, output signals of the MIMO_FIFO register 610 may report an amount of available space (n_space) and a number of stored words (n_words) of MIMO_FIFO register 610. Additionally, input signals may include a number of words to be written (wr_num), an input for data (din), and a pulse (wr_req) to trigger writing the din to the circular register 820. Also, input and output signals may include a number of words to be read out (rd_num), an output for data (dout), and a pulse (rd_req) to trigger reading the dout from the circular register 820. Each of the processing engines 546 may be provided with its own circular register 820.

Figure 9:
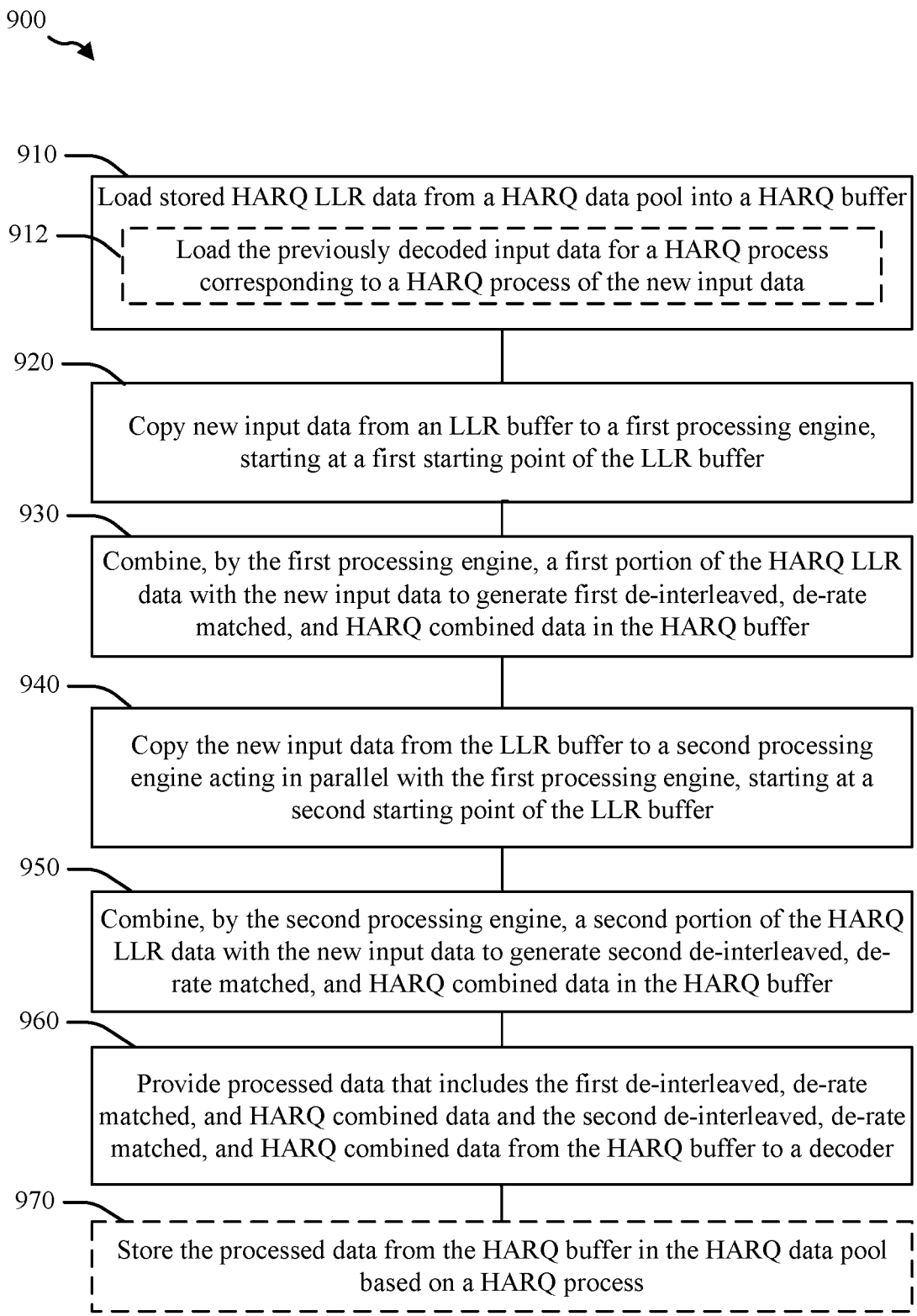
FIG. 9 is a diagram of an example method for wireless communications, in accordance with certain aspects of the present description.

FIG. 9 is a flowchart of a method 900 of wireless communication. The method 900 may be performed by a UE (e.g., the UE 104, which may include the memory 360 and which may be the entire UE 104 or a component of the UE 104 such as the TX processor 368, the RX processor 356, and/or the controller/processor 359)) for downlink transmissions and may be performed by a base station (e.g., the base station 102/180, which may include the memory 376 and which may be the entire base station 102 or a component of the base station 102 such as the TX processor 316, the RX processor 370, and/or the controller/processor 375) for uplink transmissions.

At block 910, the method 900 may include loading stored HARQ LLR data from a HARQ data pool into a HARQ buffer. In an aspect, for example, the HARQ onload controller 142, 542 may load the stored HARQ LLR data from the HARQ data pool 520 into the HARQ buffer 148, 548. The HARQ data pool 520 may store previously decoded input data for a plurality of HARQ processes. For instance, at sub-block 912, the block 910 may include loading the previously decoded input data for a HARQ process (e.g., identified by HARQ process ID 526) corresponding to a HARQ process of the new input data. The previous decoding may have been unsuccessful, and the HARQ process of the new input data may be a retransmission.

At block 920, the method 900 may include copying new input data from an LLR buffer to a first processing engine, starting at a first starting point of the LLR buffer. In an aspect, for example, the reader 530 may copy new input data from the LLR buffer 144, 544 starting at a first starting point of the LLR buffer 144, 544. For example, as illustrated in FIG. 4A and 4B, the reader 530 may start at a first offset (e_offset) for the first processing engine 146a, 546a depending on a size of the LLR buffer 544, the memory line assigned to the first processing engine 146a, 546a, and the number of coded bits. For example, in FIG. 4A, the first processing engine 146a, 546a may correspond to processing engine 0 and the reader 530 may start at offset 0. In an aspect, the reader 530 may indicate the starting offset and/or read the LLRs from the LLR buffer 544. For example, the reader 530 may copy the positive integer number, x, LLRs for the first processing engine 146a, 546a each cycle. In an aspect, copying the new input data from the LLR buffer to the first processing engine may include reading a number (e.g., x) columns of the LLR buffer to a de-interleaver and writing the number of LLRs from the de-interleaver to the first processing engine. For example, the reader 530 may read x columns of the new input data to the on-the-fly de-interleaver 600. The on-the-fly de-interleaver 600 may then write the x LLRs to the first processing engine.

At block 930, the method 900 may include combining, by the first processing engine, a first portion of the HARQ LLR data with the new input data to generate first de-interleaved, de-rate matched, and HARQ combined data in the HARQ buffer. In an aspect, for example, the first processing engine 146a, 546a may combine a first portion of the HARQ LLR data with the new input data to generate first de-interleaved, de-rate matched, and HARQ combined data in the HARQ buffer 148, 548. For example, in some implementations, the first processing engine 146a, 546a may store the first de-interleaved, de-rate matched, and HARQ combined data in the HARQ buffer 148, 548 via the arbitration block 510.

Further details of combining the HARQ LLR data with the new input data are described above with respect to FIGS. 5 and 7 and below with respect to FIG. 10.

At block 940, the method 900 may include copying the new input data from the LLR buffer to a second processing engine acting in parallel with the first de-interleaving and de-rate matching engine, starting at a second starting point of the LLR buffer. In an aspect, for example, the reader 530 may read may read the new input data from the LLR buffer 144, 544, starting at a second starting point of the LLR buffer 144, 544 to the second processing engine 146*b*, 546*b* acting in parallel with the first processing engine 146*a*, 546*a*. The second starting point may be different than the first starting point. Referring back to FIGS. 4A and 4B, the reader 530 may start at a second offset (e_offset) for the second processing engine 146*b*, 546*b* depending on a size of the LLR buffer 544, the memory line assigned to the second processing engine 146*b*, 546*b*, and the number of coded bits. For example, in FIG. 4A, the second processing engine 146*b*, 546*b* may correspond to processing engine 1 and the reader 530 may start at offset 21. In an aspect, the reader 530 may indicate the starting offset and/or read the LLRs from the LLR buffer 544. For example, the reader 530 may read two LLRs for the second processing engine 146*b*, 546*b* each cycle.

At block 950, the method 900 may include combining, by the second processing engine, a second portion of the HARQ LLR data with the new input data to generate second de-interleaved, de-rate matched, and HARQ combined data in the HARQ buffer. In an aspect, for example, the second processing engine 146*b*, 546*b* may combine the second portion of the HARQ LLR data with the new input data to generate second de-interleaved, de-rate matched, and HARQ combined data in the HARQ buffer 148, 548. The block 950 may be similar to the block 930, and further details of combining the HARQ LLR data with the new input data are described above with respect to FIGS. 5 and 7 below with respect to FIG. 10.

At block 960, the method 900 may include providing processed data that includes the first de-interleaved, de-rate matched, and HARQ combined data and the second de-interleaved, de-rate matched, and HARQ combined data from the HARQ buffer to a decoder. In an aspect, for example, the HARQ buffer 148, 548 may provide processed data that includes the first de-interleaved, de-rate matched, and HARQ combined data and the second de-interleaved, de-rate matched, and HARQ combined data from the HARQ buffer 148, 548 to the decoder 560. For example, the HARQ buffer 148, 548 may provide the processed data 562 to the decoder 560, which may perform further decoding operations based on a coding scheme (e.g., low density parity code (LDPC) or turbo-coding).

At block 970, the method 900 may optionally include storing the processed data from the HARQ buffer in the HARQ data pool based on a HARQ process. In an aspect, for example, the HARQ buffer 148, 548 and/or the decoder 560 may store the processed data from the HARQ buffer 148, 548 in the HARQ data pool 520 based on the HARQ process ID 526. Accordingly, the HARQ data pool 520 may be accessed if a retransmission for the HARQ process is received and the receive chain 500 may perform HARQ combining along with de-interleaving and de-rate matching.

Figure 10:
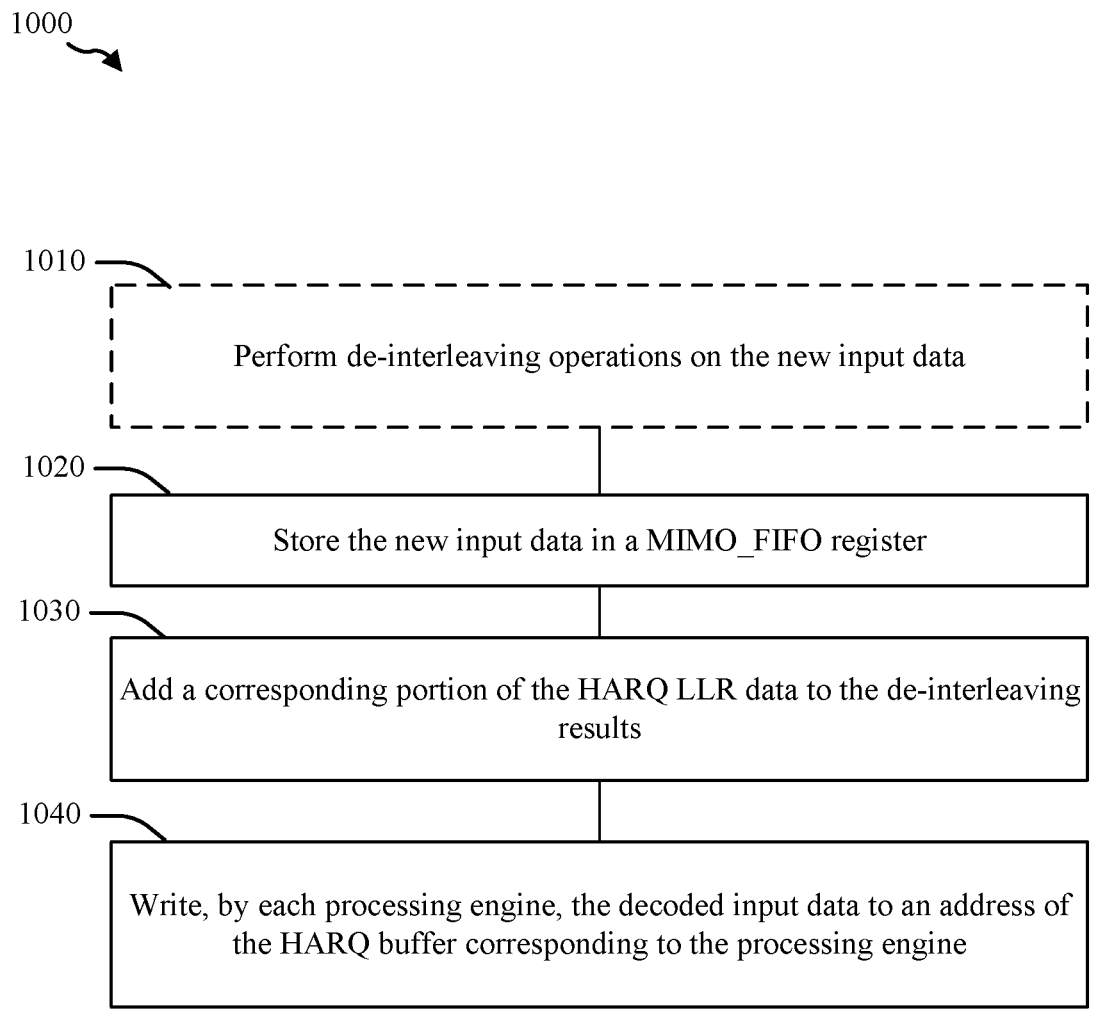
FIG. 10 is a diagram of an example method for combining new input data with HARQ LLR data, in accordance with certain aspects of the present description.

FIG. 10 is a flowchart of a method 1000 of wireless communication for combining at least a portion of the HARQ LLR data with the new input data to generate de-interleaved, de-rate matched, and HARQ combined data. The method 1000 may correspond to blocks 930 and 950 of the method 900. The method 1000 may be performed by a processing engine 146, 546.

At block 1010, the method 1000 may optionally include performing de-interleaving operations on the new input data. In an aspect, the on-the-fly de-interleaver 600 may perform the de-interleaving operations on the new input data in the, as discussed above with respect to FIG. 6. For example, the on-the-fly de-interleaver 600 may copy the input data by reading from a de-interleaver memory 400*a*, 400*b* storing LLRs, by column (e.g., two columns at a time) and write to each of the processing engines 146, 546 by row (e.g. two LLRs at a time). By providing the LLRs from a single row to the processing engines 146, 546, the on-the-fly de-interleaver 600 may provide de-interleaved LLRs to each processing engine 146, 546.

At block 1020, the method 1000 may include storing the new input data in a MIMO_FIFO register 610. In an aspect, for example, the reader 530 or the on-the-fly de-interleaver 600 may store the new input data in the MIMO-FIFO register 610. By storing the new input data in the MIMO_FIFO register 610 by row over multiple cycles, the MIMO-FIFO register 610 may include de-interleaving results 640 when a row is full, as discussed above with respect to FIG. 6.

At block 1030, the method 1000 may include adding a corresponding portion of the HARQ LLR data to the de-interleaving results. In an aspect, for example, the adder 710 may add de-interleaving results 640 for multiple processing engines 146, 546 to generate combined de-interleaving results 714. In an aspect, the adder 712 may add the corresponding portion of the HARQ LLR data 716 to the de-interleaving results 640 or the combined de-interleaving results 714, as discussed above with respect to FIG. 7.

At block 1040, the method 1000 may include writing, by each processing engine, the processed data to an address of the HARQ buffer corresponding to the processing engine. In an aspect, for example, each processing engine 146, 546 may write the processed data to an address of the HARQ buffer 548 corresponding to the respective processing engine 146, 546, as discussed above with respect to FIGS. 6 and 7. For instance, each processing engine 146, 546 may write the processed data via the arbitration block 510.

Figure 11:
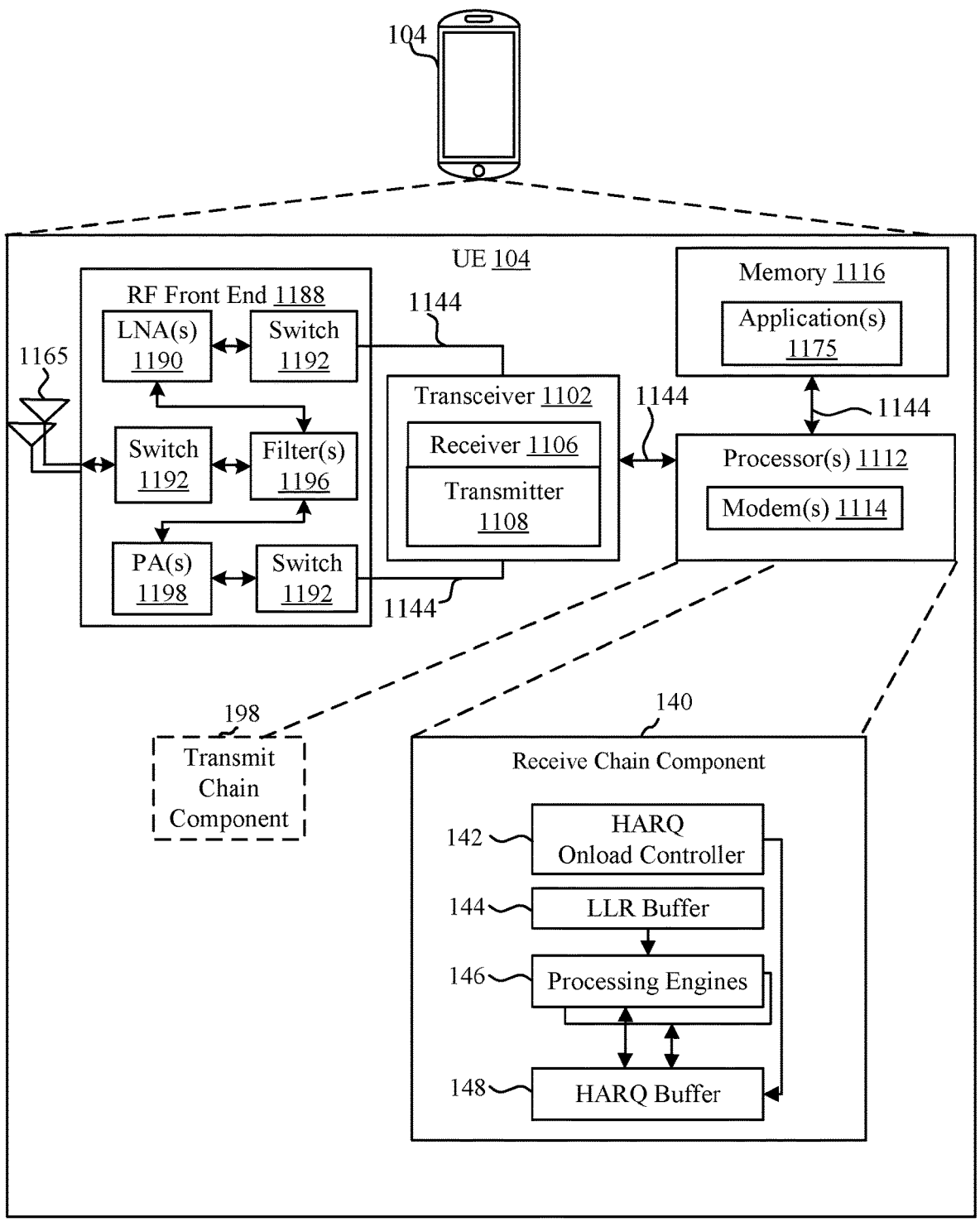
FIG. 11 is a schematic diagram of example components of the UE of FIG. 1, in accordance with certain aspects of the present description.

Referring to FIG. 11, one example of an implementation of UE 104 having the receive chain component 140 may also include a variety of other components. Some of these components have already been described above, and include components such as one or more processors 1112 and memory 1116 and transceiver 1102 in communication via one or more buses 1144, which may operate in conjunction with modem 1114 and receive chain component 140 to enable one or more of the functions described herein related to performing de-interleaving, de-rate matching, and HARQ combining. Further, the one or more processors 1112, modem 1114, memory 1116, transceiver 1102, RF front end 1188 and one or more antennas 1165, may be configured to support voice and/or data calls (simultaneously or non-simultaneously) in one or more radio access technologies. The antennas 1165 may include one or more antennas, antenna elements, and/or antenna arrays. In an alternative or additional implementation, the UE 104 may also include the transmit chain component 198.

In an aspect, the one or more processors 1112 can include a modem 1114 that uses one or more modem processors. The various functions related to receive chain component 140 may be included in modem 1114 and/or processors 1112 and, in an aspect, can be executed by a single processor, while in other aspects, different ones of the functions may be executed by a combination of two or more different processors. For example, in an aspect, the one or more processors 1112 may include any one or any combination of a modem processor, or a baseband processor, or a digital signal processor, or a transmit processor, or a receiver processor, or a transceiver processor associated with transceiver 1102. In other aspects, some of the features of the one or more processors 1112 and/or modem 1114 associated with receive chain component 140 may be performed by transceiver 1102.

Also, memory 1116 may be configured to store data used herein and/or local versions of applications 1175 or receive chain component 140 and/or one or more of the subcomponents thereof being executed by at least one processor 1112. Memory 1116 can include any type of computer-readable medium usable by a computer or at least one processor 1112, such as random access memory (RAM), read only memory (ROM), tapes, magnetic discs, optical discs, volatile memory, non-volatile memory, and any combination thereof. In an aspect, for example, memory 1116 may be a non-transitory computer-readable storage medium that stores one or more computer-executable codes defining receive chain component 140 and/or one or more of the subcomponents thereof, and/or data associated therewith, when UE 104 is operating at least one processor 1112 to execute receive chain component 140 and/or one or more of the subcomponents thereof.

Transceiver 1102 may include at least one receiver 1106 and at least one transmitter 1108. Receiver 1106 may include hardware, firmware, and/or software code executable by a processor for receiving data, the code comprising instructions and being stored in a memory (e.g., computer-readable medium). Receiver 1106 may be, for example, a radio frequency (RF) receiver. In an aspect, receiver 1106 may receive signals transmitted by at least one base station 102. Additionally, receiver 1106 may process such received signals, and also may obtain measurements of the signals, such as, but not limited to, Ec/Io, SNR, RSRP, RSSI, etc. Transmitter 1108 may include hardware, firmware, and/or software code executable by a processor for transmitting data, the code comprising instructions and being stored in a memory (e.g., computer-readable medium). A suitable example of transmitter 1108 may including, but is not limited to, an RF transmitter.

Moreover, in an aspect, UE 104 may include RF front end 1188, which may operate in communication with one or more antennas 1165 and transceiver 1102 for receiving and transmitting radio transmissions, for example, wireless communications transmitted by at least one base station 102 or wireless transmissions transmitted by UE 104. RF front end 1188 may be connected to one or more antennas 1165 and can include one or more low-noise amplifiers (LNAs) 1190, one or more switches 1192, one or more power amplifiers (PAs) 1198, and one or more filters 1196 for transmitting and receiving RF signals.

In an aspect, LNA 1190 can amplify a received signal at a desired output level. In an aspect, each LNA 1190 may have a specified minimum and maximum gain values. In an aspect, RF front end 1188 may use one or more switches 1192 to select a particular LNA 1190 and a corresponding specified gain value based on a desired gain value for a particular application.

Further, for example, one or more PA(s) 1198 may be used by RF front end 1188 to amplify a signal for an RF output at a desired output power level. In an aspect, each PA 1198 may have specified minimum and maximum gain values. In an aspect, RF front end 1188 may use one or more switches 1192 to select a particular PA 1198 and a corresponding specified gain value based on a desired gain value for a particular application.

Also, for example, one or more filters 1196 can be used by RF front end 1188 to filter a received signal to obtain an input RF signal. Similarly, in an aspect, for example, a respective filter 1196 can be used to filter an output from a respective PA 1198 to produce an output signal for transmission. In an aspect, each filter 1196 can be connected to a specific LNA 1190 and/or PA 1198. In an aspect, RF front end 1188 can use one or more switches 1192 to select a transmit or receive path using a specified filter 1196, LNA 1190, and/or PA 1198, based on a configuration as specified by transceiver 1102 and/or processor 1112.

As such, transceiver 1102 may be configured to transmit and receive wireless signals through one or more antennas 1165 via RF front end 1188. In an aspect, transceiver may be tuned to operate at specified frequencies such that UE 104 can communicate with, for example, one or more base stations 102 or one or more cells associated with one or more base stations 102. In an aspect, for example, modem 1114 can configure transceiver 1102 to operate at a specified frequency and power level based on the UE configuration of the UE 104 and the communication protocol used by modem 1114.

In an aspect, modem 1114 can be a multiband-multimode modem, which can process digital data and communicate with transceiver 1102 such that the digital data is sent and received using transceiver 1102. In an aspect, modem 1114 can be multiband and be configured to support multiple frequency bands for a specific communications protocol. In an aspect, modem 1114 can be multimode and be configured to support multiple operating networks and communications protocols. In an aspect, modem 1114 can control one or more components of UE 104 (e.g., RF front end 1188, transceiver 1102) to enable transmission and/or reception of signals from the network based on a specified modem configuration. In an aspect, the modem configuration can be based on the mode of the modem and the frequency band in use. In another aspect, the modem configuration can be based on UE configuration information associated with UE 104 as provided by the network during cell selection and/or cell reselection.

Figure 12:
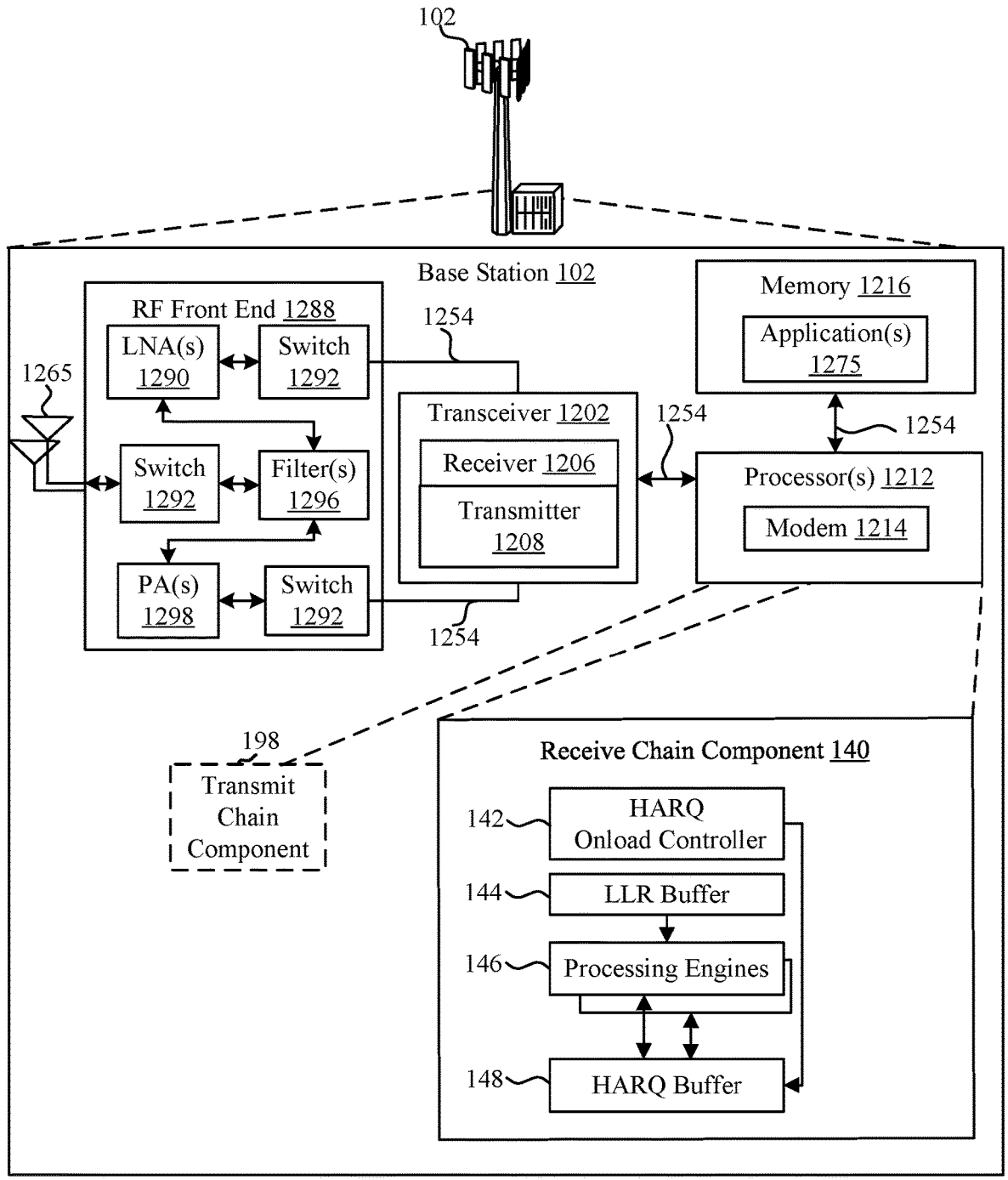
FIG. 12 is a schematic diagram of example components of the base station of FIG. 1, in accordance with certain aspects of the present description.

Referring to FIG. 12, one example of an implementation of base station 102 having the receive chain component 140 may also include a variety of other components. Some of these other components have already been described above, and include components such as one or more processors 1212 and memory 1216 and transceiver 1202 in communication via one or more buses 1254, which may operate in conjunction with modem 1214 and receive chain component 140 to enable one or more of the functions described herein related to de-interleaving, de-rate matching, and HARQ combining.

The transceiver 1202, receiver 1206, transmitter 1208, one or more processors 1212, memory 1216, applications 1275, buses 1254, RF front end 1288, LNAs 1290, switches 1292, filters 1296, PAs 1298, and one or more antennas 1265 may be the same as or similar to the corresponding components of UE 104, as described above, but configured or otherwise programmed for base station operations as opposed to UE operations.

As discussed above, the present disclosure provides for single step in place performance of de-interleaving, de-rate matching, and HARQ combining. By utilizing multiple de-interleaving, de-rate matching, and HARQ combining engines operating in parallel starting at different locations of an LLR buffer, the de-interleaving may be performed within each engine and the de-rate matching and HARQ combining may be performed by reading, combining, and writing to a HARQ buffer. The single step performance may eliminate a need to buffer all incoming LLRs for de-rate matching and the associated area penalty for circuitry implementation. In another aspect, similar savings of memory and circuit area are achieved by eliminating a separate HARQ combining stage by performing the HARQ combining along with the de-rate matching.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

Some Further Example Implementations

A first example method of wireless communication, comprising: loading stored hybrid automatic repeat request (HARQ) log likelihood ratio (LLR) data from a HARQ data pool into a HARQ buffer; copying new input data from an LLR buffer to a first processing engine, starting at a first starting point of the LLR buffer; combining, by the first processing engine, a first portion of the HARQ LLR data with the new input data to generate first de-interleaved, de-rate matched, and HARQ combined data in the HARQ buffer; copying the new input data from the LLR buffer to a second processing engine acting in parallel with the first processing engine, starting at a second starting point of the LLR buffer; combining, by the second processing engine, a second portion of the HARQ LLR data with the new input data to generate second de-interleaved, de-rate matched, and HARQ combined data in the HARQ buffer; and providing processed data that includes the first de-interleaved, de-rate matched, and HARQ combined data and the second de-interleaved, de-rate matched, and HARQ combined data from the HARQ buffer to a decoder.

The above first example method, wherein the HARQ data pool stores previously decoded processed data for a plurality of HARQ processes.

Any of the above first example methods, wherein loading the stored HARQ LLR data comprises loading the previously decoded processed data for a HARQ process of the new input data.

Any of the above first example methods, further comprising storing the processed data from the HARQ buffer in the HARQ data pool based on a HARQ process.

Any of the above first example methods, wherein combining the HARQ LLR data with the input data to generate first de-interleaved, de-rate matched, and HARQ combined data comprises: storing the new input data in a multiple-input multiple-output first-in first-out (MIMO_FIFO) register over multiple cycles to obtain de-interleaving results; and adding a corresponding portion of the HARQ LLR data to the de-interleaving results.

Any of the above first example methods, wherein combining the first portion of the HARQ LLR data with the new input data to generate the first de-interleaved, de-rate matched, and HARQ combined data comprises writing, by the first processing engine, the first de-interleaved, de-rate matched, and HARQ combined data to an address of the HARQ buffer corresponding to the first processing engine via an arbitration block.

Any of the above first example methods, wherein the new input data from the LLR buffer is interleaved and rate matched data, wherein copying the new input data from the LLR buffer to the first processing engine comprises copying a number of columns of the LLR buffer to a de-interleaver and copying the number LLRs from the de-interleaver to the first processing engine.

Any of the above first example methods, further comprising repeating the copying of the new input data from the LLR buffer and the combining of the HARQ LLR data with the input data to generate corresponding de-interleaved, de-rate matched, and HARQ combined data by one or more additional processing engines, each processing engine starting at a different starting point of the LLR buffer.

Any of the above first example methods, wherein a total number of processing engines is at least log base 2 of a constellation size of a modulation and coding scheme of the new input data.

A first example apparatus, comprising: a hybrid automatic repeat request (HARQ) data pool configured to store log likelihood ratio (LLR) data from previous transmissions; a HARQ onload controller configured to load stored HARQ LLR data from the HARQ data pool into a HARQ buffer; an LLR buffer configured to store received demodulated, interleaved, and rate matched LLR data; and a plurality of processing engines configured to, starting at different locations of the LLR buffer and the HARQ buffer: receive new input data from the LLR buffer; combine the HARQ LLR data from the HARQ buffer with the new input data to generate de-interleaved, de-rate matched, and HARQ combined data; and write the de-interleaved, de-rate matched and HARQ combined data into the HARQ buffer.

The above first example apparatus, wherein the HARQ data pool is configured to store previously decoded processed data for a plurality of HARQ processes.

Any of the above first example apparatuses, wherein each of the plurality of processing engines is configured to load the previously decoded processed data for a HARQ process of the new input data.

Any of the above first example apparatuses, wherein the HARQ buffer is configured to store the previously decoded input data from the HARQ buffer in the HARQ data pool based on a HARQ process.

Any of the above first example apparatuses, wherein each of the plurality of processing engines comprises: a MIMO_FIFO register that is configured to store the new input data over multiple cycles to obtain de-interleaving results; and an adder that is configured to add a corresponding portion of the HARQ LLR data to the de-interleaving results.

Any of the above first example apparatuses, wherein an amount of memory for the MIMO_FIFO registers for the plurality of processing engines is less than a size of a single codeblock.

Any of the above first example apparatuses, wherein each of the plurality of processing engines comprises a writer configured to write the de-interleaved, de-rate matched, and HARQ combined data to an address of the HARQ buffer corresponding to the processing engine via an arbitration block.

Any of the above first example apparatuses, wherein a total number of processing engines is at least log base 2 of a constellation size of a modulation and coding scheme of the new input data.

Any of the above first example apparatuses, further comprising a de-interleaver configured to read at least two columns of the LLR buffer and write at least two LLRs from the de-interleaver to each of the plurality of processing engines.

A second example apparatus for wireless communication, comprising: means for loading stored hybrid automatic repeat request (HARQ) log likelihood ratio (LLR) data from a HARQ data pool into a HARQ buffer; means for copying new input data from an LLR buffer starting at a first starting point of the LLR buffer; means for de-interleaving at least a first portion and a second portion of the new input data; means for combining a first portion of the HARQ LLR data with the first portion of the new input data to generate first de-interleaved, de-rate matched, and HARQ combined data in the HARQ buffer; means for combining a second portion of the HARQ LLR data with the second portion of the new input data to generate second de-interleaved, de-rate matched, and HARQ combined data in the HARQ buffer; and means for providing processed data that includes the first de-interleaved, de-rate matched, and HARQ combined data and the second de-interleaved, de-rate matched, and HARQ combined data from the HARQ buffer to a decoder.

The above second example apparatus, wherein the HARQ data pool stores previously decoded processed data for a plurality of HARQ processes and the means for loading the stored HARQ LLR data is configured to load the previously decoded processed data for a HARQ process of the new input data.

Any of the above second example apparatuses, further comprising means for storing the processed data from the HARQ buffer in the HARQ data pool based on a HARQ process.

Any of the above second example apparatuses, wherein the means for combining the first portion of the HARQ LLR data with the first portion of the new input data to generate the first de-interleaved, de-rate matched, and HARQ combined data is configured to: store the first portion of the new input data in a multiple-input multiple-output first-in first-out (MIMO_FIFO) register over multiple cycles to obtain de-interleaving results; and add a corresponding portion of the HARQ LLR data to the de-interleaving results.

Any of the above second example apparatuses, wherein the means for combining the first portion of the HARQ LLR data with the first portion of the new input data to generate the first de-interleaved, de-rate matched, and HARQ combined data is configured to write the first de-interleaved, de-rate matched, and HARQ combined data to an address of the HARQ buffer corresponding to the means for combining the first portion of the HARQ LLR data with the new input data.

Any of the above second example apparatuses, wherein the new input data from the LLR buffer is interleaved and rate matched data, wherein the means for de-interleaving is configured to receive a number of columns of the LLR buffer and write the number of de-interleaved LLRs to the means for combining the first portion of the HARQ LLR data with the first portion of the new input data.

Any of the above second example apparatuses, further comprising one or more additional means for combining an additional portion of the HARQ LLR data with the new input data to generate corresponding de-interleaved de-rate matched and HARQ combined data in the HARQ buffer, each additional means starting at a different starting point of the LLR buffer.

Any of the above second example apparatuses, wherein a total number of means for reading new input data from the LLR buffer is at least log base 2 of a constellation size of a modulation and coding scheme of the new input data.

An example non-transitory computer-readable medium storing computer executable code, the code when executed by a processor causes the processor to: load stored hybrid automatic repeat request (HARQ) log likelihood ratio (LLR) data from a HARQ data pool into a HARQ buffer; copy new input data from an LLR buffer to a first processing engine, starting at a first starting point of the LLR buffer; combine, by the first processing engine, a first portion of the HARQ LLR data with the new input data to generate first de-interleaved, de-rate matched, and HARQ combined data in the HARQ buffer; copy the new input data from the LLR buffer to a second processing engine acting in parallel with the first processing engine, starting at a second starting point of the LLR buffer; combine, by the second processing engine, a second portion of the HARQ LLR data with the new input data to generate second de-interleaved, de-rate matched, and HARQ combined data in the HARQ buffer; and provide processed data that includes the first de-interleaved, de-rate matched, and HARQ combined data and the second de-interleaved, de-rate matched, and HARQ combined data from the HARQ buffer to a decoder.

The above example non-transitory computer-readable medium, wherein the HARQ data pool stores previously decoded processed data for a plurality of HARQ processes and the code to load the stored HARQ LLR data comprises code to the previously decoded processed data for a HARQ process of the new input data.

Any of the above example non-transitory computer-readable mediums, wherein the code to combine, by the first processing engine, a first portion of the HARQ LLR data with the new input data, comprises code to: store the new input data in a multiple-input multiple-output first-in first-out (MIMO_FIFO) register over multiple cycles to obtain de-interleaving results; and add the first portion of the HARQ LLR data to the de-interleaving results.

Any of the above example non-transitory computer-readable mediums, further comprising code to repeat the copying of the new input data from the LLR buffer and the combining the HARQ LLR data with the new input data to generate corresponding de-interleaved de-rate matched, and HARQ combined data by one or more additional processing engines, each processing engine starting at a different starting point of the LLR buffer, wherein a total number of processing engines is at least log base 2 of a constellation size of a modulation and coding scheme of the new input data.

What is claimed is:

1. A method of wireless communication, comprising:
   loading stored hybrid automatic repeat request (HARQ) log likelihood ratio (LLR) data from a HARQ data pool into a HARQ buffer;
   copying new input data from an LLR buffer to a first processing engine, starting at a first starting point of the LLR buffer;
   combining, by the first processing engine, a first portion of the HARQ LLR data with the new input data to generate first de-interleaved, de-rate matched, and HARQ combined data in the HARQ buffer;
   copying the new input data from the LLR buffer to a second processing engine acting in parallel with the first processing engine, starting at a second starting point of the LLR buffer;
   combining, by the second processing engine, a second portion of the HARQ LLR data with the new input data to generate second de-interleaved, de-rate matched, and HARQ combined data in the HARQ buffer; and
   providing processed data that includes the first de-interleaved, de-rate matched, and HARQ combined data and the second de-interleaved, de-rate matched, and HARQ combined data from the HARQ buffer to a decoder.

2. The method of claim 1, wherein the HARQ data pool stores previously decoded processed data for a plurality of HARQ processes.

3. The method of claim 2, wherein loading the stored HARQ LLR data comprises loading the previously decoded processed data for a HARQ process of the new input data.

4. The method of claim 1, further comprising storing the processed data from the HARQ buffer in the HARQ data pool based on a HARQ process.

5. The method of claim 1, wherein combining the HARQ LLR data with the new input data to generate first de-interleaved, de-rate matched, and HARQ combined data comprises:
   storing the new input data in a multiple-input multiple-output first-in first-out (MIMO_FIFO) register over multiple cycles to obtain de-interleaving results; and
   adding a corresponding portion of the HARQ LLR data to the de-interleaving results.

6. The method of claim 1, wherein combining the first portion of the HARQ LLR data with the new input data to generate the first de-interleaved, de-rate matched, and HARQ combined data comprises writing, by the first processing engine, the first de-interleaved, de-rate matched, and HARQ combined data to an address of the HARQ buffer corresponding to the first processing engine via an arbitration block.

7. The method of claim 1, wherein the new input data from the LLR buffer is interleaved and rate matched data, wherein copying the new input data from the LLR buffer to the first processing engine comprises copying a number of columns of the LLR buffer to a de-interleaver and copying a number LLRs equal to the number of columns from the de-interleaver to the first processing engine.

8. The method of claim 1, further comprising repeating the copying of the new input data from the LLR buffer and the combining of the HARQ LLR data with the new input data to generate corresponding de-interleaved, de-rate matched, and HARQ combined data by one or more additional processing engines, each processing engine starting at a different starting point of the LLR buffer.

9. The method of claim 8, wherein a total number of processing engines is at least log base 2 of a constellation size of a modulation and coding scheme of the new input data.

10. An apparatus, comprising:
    a hybrid automatic repeat request (HARQ) data pool configured to store log likelihood ratio (LLR) data from previous transmissions;
    a HARQ onload controller configured to load stored HARQ LLR data from the HARQ data pool into a HARQ buffer;
    an LLR buffer configured to store received demodulated, interleaved, and rate matched LLR data; and
    a plurality of processing engines configured to, starting at different locations of the LLR buffer and the HARQ buffer:
    receive new input data from the LLR buffer;
    combine the HARQ LLR data from the HARQ buffer with the new input data to generate de-interleaved, de-rate matched, and HARQ combined data; and
    write the de-interleaved, de-rate matched and HARQ combined data into the HARQ buffer.

11. The apparatus of claim 10, wherein the HARQ data pool is configured to store previously decoded processed data for a plurality of HARQ processes.

12. The apparatus of claim 11, wherein each of the plurality of processing engines is configured to load the previously decoded processed data for a HARQ process of the new input data.

13. The apparatus of claim 11, wherein the HARQ buffer is configured to store the previously decoded processed data from the HARQ buffer in the HARQ data pool based on a HARQ process.

14. The apparatus of claim 10, wherein each of the plurality of processing engines comprises:
    a MIMO_FIFO register that is configured to store the new input data over multiple cycles to obtain de-interleaving results; and
    an adder that is configured to add a corresponding portion of the HARQ LLR data to the de-interleaving results.

15. The apparatus of claim 14, wherein an amount of memory for each MIMO_FIFO register for the plurality of processing engines is less than a size of a single codeblock.

16. The apparatus of claim 10, wherein each processing engine of the plurality of processing engines comprises a writer configured to write the de-interleaved, de-rate matched, and HARQ combined data to an address of the HARQ buffer corresponding to the processing engine via an arbitration block.

17. The apparatus of claim 10, wherein a total number of processing engines is at least log base 2 of a constellation size of a modulation and coding scheme of the new input data.

18. The apparatus of claim 10, further comprising a de-interleaver configured to read at least two columns of the LLR buffer and write at least two LLRs from the de-interleaver to each of the plurality of processing engines.

19. An apparatus for wireless communication, comprising:
- means for loading stored hybrid automatic repeat request (HARQ) log likelihood ratio (LLR) data from a HARQ data pool into a HARQ buffer;
- means for copying new input data from an LLR buffer starting at a first starting point of the LLR buffer;
- means for de-interleaving at least a first portion and a second portion of the new input data;
- means for combining a first portion of the HARQ LLR data with the first portion of the new input data to generate first de-interleaved, de-rate matched, and HARQ combined data in the HARQ buffer;
- means for combining a second portion of the HARQ LLR data with the second portion of the new input data to generate second de-interleaved, de-rate matched, and HARQ combined data in the HARQ buffer; and
- means for providing processed data that includes the first de-interleaved, de-rate matched, and HARQ combined data and the second de-interleaved, de-rate matched, and HARQ combined data from the HARQ buffer to a decoder.

20. The apparatus of claim 19, wherein the HARQ data pool is configured to store previously decoded processed data for a plurality of HARQ processes and the means for loading the stored HARQ LLR data is configured to load the previously decoded processed data for a HARQ process of the new input data.

21. The apparatus of claim 19, further comprising means for storing the processed data from the HARQ buffer in the HARQ data pool based on a HARQ process.

22. The apparatus of claim 19, wherein the means for combining the first portion of the HARQ LLR data with the first portion of the new input data to generate the first de-interleaved, de-rate matched, and HARQ combined data is configured to:
- store the first portion of the new input data in a multiple-input multiple-output first-in first-out (MIMO_FIFO) register over multiple cycles to obtain de-interleaving results; and
- add a corresponding portion of the HARQ LLR data to the de-interleaving results.

23. The apparatus of claim 19, wherein the means for combining the first portion of the HARQ LLR data with the first portion of the new input data to generate the first de-interleaved, de-rate matched, and HARQ combined data is configured to write the first de-interleaved, de-rate matched, and HARQ combined data to an address of the HARQ buffer corresponding to the means for combining the first portion of the HARQ LLR data with the new input data.

24. The apparatus of claim 19, wherein the new input data from the LLR buffer is interleaved and rate matched data, wherein the means for de-interleaving is configured to receive a number of columns of the LLR buffer and write a number of de-interleaved LLRs equal to the number of columns to the means for combining the first portion of the HARQ LLR data with the first portion of the new input data.

25. The apparatus of claim 19, further comprising one or more additional means for combining an additional portion of the HARQ LLR data with the new input data to generate corresponding de-interleaved de-rate matched and HARQ combined data in the HARQ buffer, each additional means starting at a different starting point of the LLR buffer.

26. The apparatus of claim 25, wherein a total number of means for reading new input data from the LLR buffer is at least log base 2 of a constellation size of a modulation and coding scheme of the new input data.

27. A non-transitory computer-readable medium storing computer executable code, the code when executed by a processor causes the processor to:
- load stored hybrid automatic repeat request (HARQ) log likelihood ratio (LLR) data from a HARQ data pool into a HARQ buffer;
- copy new input data from an LLR buffer to a first processing engine, starting at a first starting point of the LLR buffer;
- combine, by the first processing engine, a first portion of the HARQ LLR data with the new input data to generate first de-interleaved, de-rate matched, and HARQ combined data in the HARQ buffer;
- copy the new input data from the LLR buffer to a second processing engine acting in parallel with the first processing engine, starting at a second starting point of the LLR buffer;
- combine, by the second processing engine, a second portion of the HARQ LLR data with the new input data to generate second de-interleaved, de-rate matched, and HARQ combined data in the HARQ buffer; and
- provide processed data that includes the first de-interleaved, de-rate matched, and HARQ combined data and the second de-interleaved, de-rate matched, and HARQ combined data from the HARQ buffer to a decoder.

28. The non-transitory computer-readable medium of claim 27, wherein the HARQ data pool stores previously decoded processed data for a plurality of HARQ processes and the code to load the stored HARQ LLR data comprises code to the previously decoded processed data for a HARQ process of the new input data.

29. The non-transitory computer-readable medium of claim 27, wherein the code to combine, by the first processing engine, a first portion of the HARQ LLR data with the new input data, comprises code to:
- store the new input data in a multiple-input multiple-output first-in first-out (MIMO_FIFO) register over multiple cycles to obtain de-interleaving results; and
- add the first portion of the HARQ LLR data to the de-interleaving results.

30. The non-transitory computer-readable medium of claim 27, further comprising code to repeat the copying of the new input data from the LLR buffer and the combining the HARQ LLR data with the new input data to generate corresponding de-interleaved de-rate matched, and HARQ combined data by one or more additional processing engines, each processing engine starting at a different starting point of the LLR buffer, wherein a total number of processing engines is at least log base 2 of a constellation size of a modulation and coding scheme of the new input data.

* * * * *